(12) United States Patent
Watts et al.

(10) Patent No.: US 12,074,149 B2
(45) Date of Patent: Aug. 27, 2024

(54) DEVICE PACKAGES WITH UNIFORM COMPONENTS AND METHODS OF FORMING THE SAME

(71) Applicant: MACOM Technology Solutions Holdings, Inc., Lowell, MA (US)

(72) Inventors: Michael E. Watts, Scottsdale, AZ (US); James Krehbiel, Chandler, AZ (US); Mario Bokatius, Chandler, AZ (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 239 days.

(21) Appl. No.: 17/168,251

(22) Filed: Feb. 5, 2021

(65) Prior Publication Data

US 2022/0254762 A1    Aug. 11, 2022

(51) Int. Cl.
*H01L 25/16* (2023.01)
*H01L 23/00* (2006.01)
*H01L 23/367* (2006.01)
*H01L 23/66* (2006.01)

(52) U.S. Cl.
CPC ............ *H01L 25/16* (2013.01); *H01L 23/367* (2013.01); *H01L 23/66* (2013.01); *H01L 24/48* (2013.01); *H01L 2223/6655* (2013.01); *H01L 2224/48137* (2013.01); *H01L 2224/48175* (2013.01); *H01L 2924/1033* (2013.01); *H01L 2924/13064* (2013.01); *H01L 2924/1421* (2013.01); *H01L 2924/19105* (2013.01); *H01L 2924/30111* (2013.01)

(58) Field of Classification Search
CPC ....... H01L 25/16; H01L 23/367; H01L 23/66; H01L 24/48; H01L 2223/6655; H01L 2224/48137; H01L 2224/48175; H01L 2924/1033; H01L 2924/13064; H01L 2924/1421; H01L 2924/19105; H01L 2924/30111; H03F 2200/451; H03F 1/0288; H03F 1/565
USPC .......................................................... 257/713
See application file for complete search history.

(56) References Cited

U.S. PATENT DOCUMENTS

| | | |
|---|---|---|
| 2004/0113697 A1 | 6/2004 | Pengelly et al. |
| 2010/0246153 A1 | 9/2010 | Buer |
| 2014/0145791 A1 | 5/2014 | Svechtarov |
| 2015/0163044 A1* | 6/2015 | Analui ............... H03F 3/195 370/295 |

(Continued)

OTHER PUBLICATIONS

Notification of Transmittal of the International Search Report and the Written Opinion of the International Searching Authority, or the Declaration, in corresponding PCT Application No. PCT/US2022/014179 (Jul. 4, 2022).

(Continued)

*Primary Examiner* — Duy T Nguyen
(74) *Attorney, Agent, or Firm* — Myers Bigel, P.A.

(57) ABSTRACT

A semiconductor device package includes a first and a second input lead and a plurality of uniform transistor-based components, the plurality of uniform transistor-based components comprising a first subset of the uniform transistor-based components coupled to the first input lead and a second subset of the uniform transistor-based components coupled to the second input lead. The first subset and the second subset are arranged in an asymmetric configuration with respect to one another.

19 Claims, 22 Drawing Sheets

(56) References Cited

U.S. PATENT DOCUMENTS

| | | | | |
|---|---|---|---|---|
| 2015/0289360 A1* | 10/2015 | Leong | .................... | H05K 1/181 |
| | | | | 361/782 |
| 2016/0173040 A1* | 6/2016 | Cho | ........................ | H03F 3/193 |
| | | | | 330/295 |
| 2016/0315587 A1* | 10/2016 | Zhang | .................... | H03F 3/195 |
| 2017/0018546 A1* | 1/2017 | Zhai | ........................ | H01L 24/20 |
| 2017/0288724 A1* | 10/2017 | Kamgaing | ............... | H04B 1/48 |
| 2017/0290156 A1* | 10/2017 | Sturcken | .................. | H03H 7/38 |
| 2020/0059204 A1* | 2/2020 | Kahloon | ................. | H01L 25/16 |
| 2020/0366259 A1* | 11/2020 | Sun | ........................ | H03F 3/213 |
| 2021/0021237 A1* | 1/2021 | Hill | ........................ | H01L 23/66 |
| 2021/0135639 A1* | 5/2021 | Jones | .................... | H03F 1/565 |

OTHER PUBLICATIONS

Wiens et al. "Tunable In-package Impedance Matching for High Power Transistors based on Printed Ceramics" 2015 10th European Microwave Integrated Circuits Conference (EuMIC) (pp. 385-388) (Sep. 7-8, 2015).

Taiwan Office Action corresponding to Taiwanese Patent Application No. 111103860 (Foreign Text, 17 Pages, English Translation Thereof, 10 Pages) (Sep. 29, 2022).

* cited by examiner

DEVICE PACKAGES WITH UNIFORM COMPONENTS AND METHODS OF FORMING THE SAME

FIELD

The present disclosure relates to device packages including transistor devices and methods of forming such device packages.

BACKGROUND

Electrical circuits requiring high power handling capability while operating at high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz) have become more prevalent. In particular, there is now a high demand for radio frequency ("RF") transistor amplifiers that are used to amplify RF signals at frequencies of, for example, 500 MHz and higher (including microwave frequencies). These RF transistor amplifiers may need to exhibit high reliability, good linearity and handle high output power levels.

Some transistor amplifiers are implemented in silicon or wide bandgap semiconductor materials, such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based transistor amplifiers are often implemented using laterally diffused metal oxide semiconductor ("LDMOS") transistors. Silicon LDMOS transistor amplifiers can exhibit high levels of linearity and may be relatively inexpensive to fabricate. Group III nitride-based transistor amplifiers are often implemented as High Electron Mobility Transistors ("HEMT") and are primarily used in applications requiring high power and/or high frequency operation where LDMOS transistor amplifiers may have inherent performance limitations.

Transistor amplifiers may include one or more amplification stages, with each stage typically implemented as a transistor amplifier. In order to increase the output power and current handling capabilities, transistor amplifiers are typically implemented in a "unit cell" configuration in which a large number of individual "unit cell" transistors are arranged electrically in parallel. A transistor amplifier may be implemented as a single integrated circuit chip or "die," or may include a plurality of dies. When multiple transistor amplifier dies are used, they may be connected in series and/or in parallel.

Transistor amplifiers often include matching circuits, such as (1) impedance matching circuits that are designed to improve the impedance match (for signals at the fundamental operating frequency of the amplifier) between the transistor die and transmission lines connected thereto and (2) harmonic termination circuits that are designed to at least partly terminate harmonics that may be generated during device operation, such as second and third order harmonics. The transistor die(s) as well as the impedance matching and harmonic termination circuits may be enclosed in a package. Electrical leads may extend from the package that are used to electrically connect the transistor die to external circuit elements such as input and output transmission lines and bias voltage sources.

SUMMARY

According to some embodiments of the present disclosure, a semiconductor device package includes a first and a second input lead; and a plurality of uniform transistor-based components, the plurality of uniform transistor-based components comprising a first subset of the uniform transistor-based components coupled to the first input lead and a second subset of the uniform transistor-based components coupled to the second input lead. The first subset and the second subset are arranged in an asymmetric configuration with respect to one another.

In some embodiments, the first subset of the uniform transistor-based components are coupled to the first input lead by one or more bondwires configured to deliver a first input power level to the first subset, and the second subset of the uniform transistor-based components are coupled to the second input lead by one or more bondwires configured to deliver a second input power level to the second subset.

In some embodiments, the first input power level is different than the second input power level.

In some embodiments, each of the uniform transistor-based components of the first subset and the second subset comprises a same first transistor die.

In some embodiments, the first transistor die is a Group III nitride-based transistor amplifier.

In some embodiments, a first sum of gate peripheries of transistors associated with the first subset of the uniform transistor-based components is different than a second sum of gate peripheries of transistors associated with the second subset of the uniform transistor-based components.

In some embodiments, wherein each of the uniform transistor-based components of the first subset and the second subset comprises a first integrated passive device (IPD) circuit.

In some embodiments, the first IPD circuit comprises a main element and a tunable element that is configured to be selectively connected to the main element to alter a characteristic of the first IPD circuit.

In some embodiments, the main element and the tunable element each comprise a capacitive device, and the tunable element is configured to increase a capacitance of the first IPD circuit through connection to the main element.

In some embodiments, the first IPD circuit comprises a plurality of IPD circuits.

In some embodiments, the first IPD circuit is electrically connected between the first input lead and a transistor die of the uniform transistor-based component, and wherein a second IPD circuit of the plurality of IPD circuits is electrically connected between the first input lead and the first IPD circuit.

In some embodiments, the first IPD circuit of each of the uniform transistor-based components of the first subset is the same as the first IPD circuit of each of the second subset.

According to some embodiments of the present disclosure, a semiconductor device package includes a first and a second input lead; a plurality of transistor dies, the plurality of transistor dies comprising a first subset of the plurality of transistor dies coupled to the first input lead and a second subset of the plurality of transistor dies coupled to the second input lead; and a plurality of uniform integrated passive device (IPD) circuits, a first subset of the plurality of uniform IPD circuits connected to one or more of the first subset of the plurality of transistor dies and a second subset of the uniform IPD circuits connected to one or more of the second subset of the plurality of transistor dies, the first subset of the uniform IPD circuits selectively configured differently than the second subset of the uniform IPD circuits In some embodiments, each of the plurality of uniform IPD circuit comprises a main element and a tunable element that is configured to be selectively connected to the main element to alter a configuration of the uniform IPD circuit.

In some embodiments, the main element and the tunable element each comprise a capacitive device, and the tunable element is configured to be selectively connected to the main element to increase a capacitance of the uniform IPD circuit.

In some embodiments, each of the first subset and the second subset of the plurality of transistor dies comprises a same transistor die.

In some embodiments, a first sum of gate peripheries of the first subset of the plurality of transistor dies is different than a second sum of gate peripheries of the second subset of the plurality of transistor dies.

In some embodiments, wherein an average output power of each of the plurality of transistor dies is less than 20 W.

In some embodiments, a total gate periphery of each of the plurality of transistor dies is less than 15 mm.

In some embodiments, the plurality of transistor dies are part of a massive Multiple Input Multiple Output (mMIMO) antenna.

According to some embodiments of the present disclosure, a semiconductor device package includes a plurality of input leads; a plurality of output leads; and a plurality of uniform transistor-based components, the plurality of uniform transistor-based components comprising: a first subset of the plurality of uniform transistor-based components that are electrically connected between a first input lead of the input leads and a first output lead of the output leads; and a second subset of two or more of the plurality of uniform transistor-based components that are electrically connected between a second input lead of the input leads and a second output lead of the output leads. Each of the plurality of uniform transistor-based components comprises a transistor die, and a first number of the uniform transistor-based components in the first subset is different than a second number of the uniform transistor-based components in the second subset.

In some embodiments, each of the plurality of uniform transistor-based components comprises an integrated passive device (IPD) circuit.

In some embodiments, the IPD circuit of each of the plurality of uniform transistor-based components comprises a main element and a tunable element that is configured to be selectively connected to the main element to alter a characteristic of the uniform transistor-based component.

In some embodiments, the main element and the tunable element each comprise a capacitive device, and the tunable element is configured to be connected to the main element to increase a capacitance of the IPD circuit.

In some embodiments, the IPD circuit of the first subset of the plurality of uniform transistor-based components is a plurality of IPD circuits.

In some embodiments, each IPD circuit of the plurality of uniform transistor-based components is a same IPD circuit.

In some embodiments, the input leads and the output leads are part of a dual-flat no-leads (DFN) package or a quad-flat no-leads (QFN) package.

In some embodiments, the semiconductor device package further includes a plurality of bondwires between the first input lead and respective ones of the first subset of the plurality of uniform transistor-based components.

According to some embodiments of the present disclosure, a semiconductor device package includes an input lead; an output lead; and a plurality of uniform integrated passive device (IPD) circuits, each uniform IPD circuit comprising a main element and a tunable element that is configured to be selectively connected to the main element to alter a characteristic of the uniform IPD circuit.

In some embodiments, the semiconductor device package further includes a bondwire connecting the main element of the IPD circuit and the tunable element of the IPD circuit.

In some embodiments, the main element and the tunable element each comprise a capacitive device, and the tunable element is configured to be selectively coupled to the main element to increase a capacitance of the IPD circuit.

In some embodiments, wherein the input lead comprises a plurality of input leads, the output lead comprises a plurality of output leads, a first subset of the plurality of uniform IPD circuits are electrically connected between a first input lead of the input leads and a first output lead of the output leads, and a second subset of two or more of the plurality of uniform IPD circuits are electrically connected between a second input lead of the input leads and a second output lead of the output leads.

In some embodiments, a first number of uniform IPD circuits in the first subset is different than a second number of uniform IPD circuits in the second subset.

In some embodiments, the semiconductor device package further includes a first plurality of transistor dies, each of the first plurality of transistor dies respectively coupled to a uniform IPD circuit of the first subset of the plurality of uniform IPD circuits and a second plurality of transistor dies, each of the second plurality of transistor dies respectively coupled to a uniform IPD circuit of the second subset of the plurality of uniform IPD circuits.

In some embodiments, each of the first plurality of transistor dies and the second plurality of transistor dies comprises a same transistor die.

In some embodiments, a first uniform IPD circuit of the plurality of uniform IPD circuits comprises a bondwire electrically connecting the main element to the tunable element, and the tunable element of a second uniform IPD circuit of the plurality of uniform IPD circuits is not connected to the main element of the second uniform IPD circuits.

In some embodiments, a first uniform IPD circuit of the plurality of uniform IPD circuits is electrically connected to the input lead, and a second uniform IPD circuit of the plurality of uniform IPD circuits is electrically connected to the output lead and/or the first uniform IPD circuit.

According to some embodiments of the present disclosure, a method of fabricating a semiconductor device package includes arranging a plurality of uniform transistor-based components in a first package and a second package, respectively; selectively connecting first bondwires to the uniform transistor-based components of the first package in a first configuration; and selectively connecting second bondwires to the uniform transistor-based components of the second package in a second configuration, different from the first configuration.

In some embodiments, each of the uniform transistor-based components of the first package and the second package comprises a same first transistor die.

In some embodiments, each of the uniform transistor-based components comprises an integrated passive device (IPD) circuit, the IPD circuit comprising a main element and a tunable element that is configured to be selectively connected to the main element to alter a characteristic of the uniform transistor-based component.

In some embodiments, selectively connecting the first bondwires to the uniform transistor-based components of the first package comprises connecting at least one of the first bondwires between the main element of the IPD circuit and the tunable element of the IPD circuit of at least one of the plurality of uniform transistor-based components of the first package.

In some embodiments, the first package comprises a plurality of input leads and selectively connecting the first bondwires to the uniform transistor-based components of the first package comprises connecting a first subset of the first bondwires between a first subset of the plurality of uniform transistor-based components of the first package and a first input lead of the input leads and connecting a second subset of the first bondwires between a second subset of the plurality of uniform transistor-based components and a second input lead of the input leads.

In some embodiments, a first number of uniform transistor-based components in the first subset is different than a second number of uniform transistor-based components in the second subset.

In some embodiments, arranging the plurality of uniform transistor-based components in the first package and the second package comprises bonding the uniform transistor-based components of the first package to a first submount of the first package in a first layout and bonding the uniform transistor-based components of the second package to a second submount of the second package in a second layout that is the same as the first layout.

According to some embodiments of the present disclosure, a configurable semiconductor device platform includes a submount; an input lead and output lead coupled to the submount; and a plurality of uniform transistor dies, each of the uniform transistor dies configured to be selectively coupled in one or more subsets to the input lead and the output lead.

In some embodiments, the configurable semiconductor device platform further includes a plurality of uniform integrated passive device (IPD) circuits, each uniform IPD circuit comprising a main element and a tunable element that is configured to be selectively connected to the main element to alter a characteristic of the uniform IPD circuit.

In some embodiments, the main element and the tunable element each comprise a capacitive device, and the tunable element is configured to be electrically connected to the main element by a bondwire to increase a capacitance of the uniform IPD circuit.

In some embodiments, the uniform IPD circuit is a plurality of uniform IPD circuits.

In some embodiments, a first uniform IPD circuit of the plurality of uniform IPD circuits is on a first side of a first uniform transistor die of the plurality of uniform transistor dies, and a second uniform IPD circuit of the plurality of uniform IPD circuits is on a second side of the first uniform transistor die.

In some embodiments, a first uniform IPD circuit and a second uniform IPD circuit of the plurality of uniform IPD circuits are on the submount between a first uniform transistor die of the plurality of uniform transistor dies and the input lead.

In some embodiments, each uniform IPD circuit of the plurality of uniform IPD circuits is a same IPD circuit.

In some embodiments, each transistor die of the plurality of uniform transistor dies is a same transistor die.

In some embodiments, an average output power of each of the plurality of uniform transistor dies is less than 20 W.

In some embodiments, a total gate periphery of each of the plurality of uniform transistor dies is less than 15 mm.

In some embodiments, the plurality of uniform transistor dies are part of a massive Multiple Input Multiple Output (mMIMO) antenna.

DETAILED DESCRIPTION

Figure 1A:
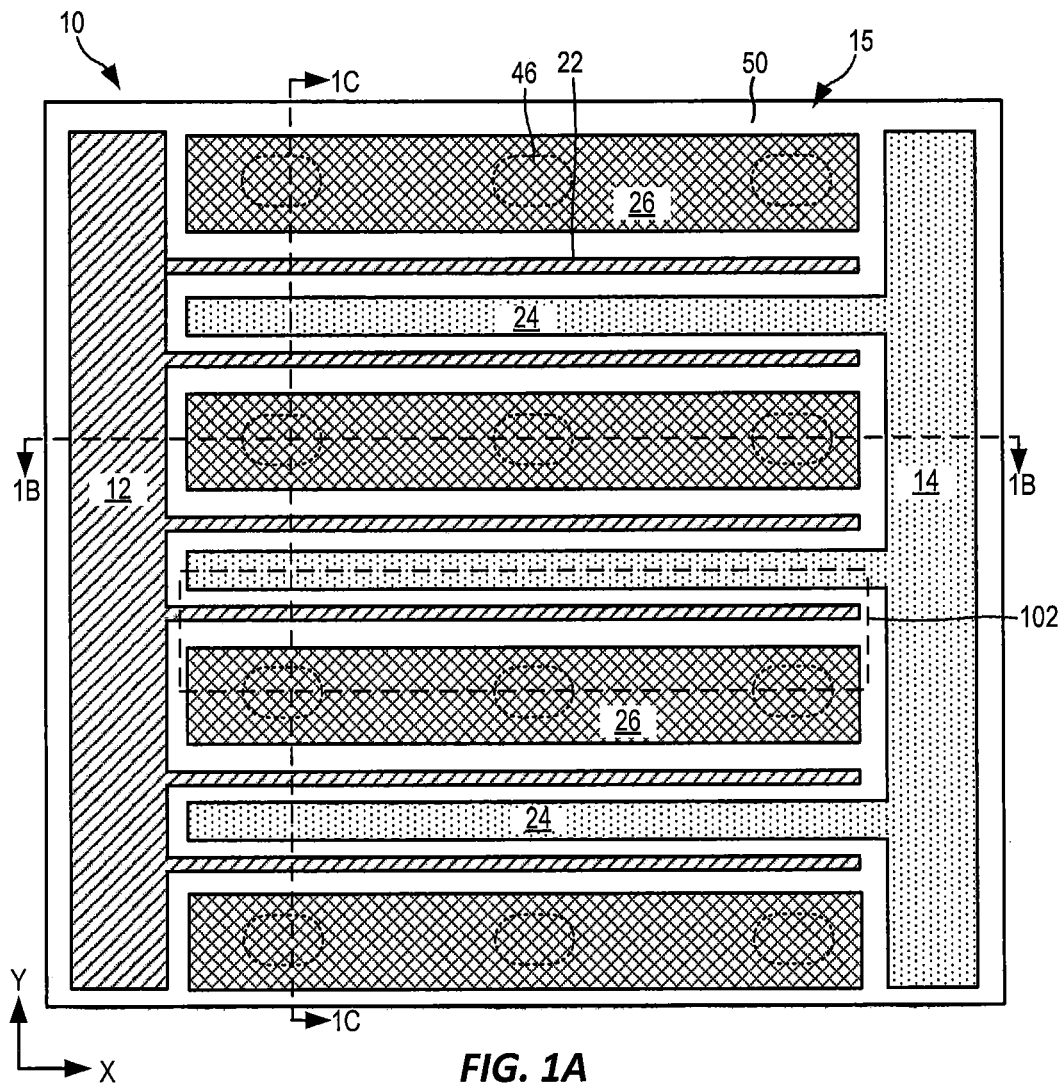
FIGS. 1A-1C schematically illustrate the design of a representative Group III nitride-based transistor that may be included in uniform transistor-based components according to some embodiments of the present disclosure.

Pursuant to embodiments of the present disclosure, reconfigurable amplifier packages are provided that include a plurality of uniform components arranged in a uniform fashion that may be interconnected to form a transistor package having desired characteristics, Each uniform component may comprise a transistor die and/or one or more matching devices such as, for example, integrated passive device (IPD) circuits. The number of uniform components included in the amplifier as well as the electrical connections between the uniform components may be selected to construct amplifier packages having desired characteristics. Bondwires may be used to interconnect the uniform components, and the number and type of bondwires used may be selected to tune characteristics of the amplifier packages. Moreover, the matching devices may include at least one tunable element so that the matching devices included in the uniform components may be tuned to have desired performance characteristics. The techniques disclosed herein may allow a wide variety of amplifier packages to be formed using a single uniform component design. This may greatly reduce manufacturing complexity. In some embodiments, the uniform components may be uniform transistor-based components. As used herein, a uniform transistor-based component is intended to cover embodiments in which a transistor of the uniform transistor-based components may be uniform across the uniform transistor-based components, as well as embodiments in which the matching circuits of the uniform components may be uniform across the uniform transistor-based components, but the transistors of the uniform transistor-based components vary.

Manufacturing cost and the complexity of the manufacturing process is an important consideration for many amplifier packages. As the number of individual components included in a product line increases (e.g., many different transistor die designs and many different IPD designs), the complexity of the manufacturing process also generally tends to increase. For example, die bonding machines are often used to select individual dies from a wafer containing such dies, place the die in a package, and/or connect bondwires between the individual dies. Some die bonding machines may utilize a single wafer for bonding. If a semiconductor package utilizes multiple different die that are sourced from many wafers, the assembly complexity goes up significantly. For example, changeovers between wafers may be needed due to the wafer limits of the bonding machine and, as a result, cost due to process time increases. The present way to mitigate this type of assembly complexity may include the use of more complex die bonders, which may have a significant cost and may themselves increase complexity (e.g., operational complexity).

The present disclosure describes techniques for forming a wide variety of different packaged amplifiers using a plurality of uniform transistor-based components. As used herein a "uniform" component and/or "uniform" transistor-based component means that each of the uniform transistor-based components of a plurality of uniform transistor-based components may include a same number and type of devices arranged in a same configuration (e.g., a physical location and spacing), within manufacturing tolerances, as others of the uniform transistor-based components (with the exception of the bondwires, discussed further herein). The same type of device may include devices having a common configuration, size, and/or design. However, in some embodiments, not all of the devices within a particular uniform component and/or uniform transistor-based component need be uniform and/or identical. In other words, a first uniform transistor-based component is considered to be uniform to a second uniform transistor-based component if they include a same number and type of devices arranged in a same configuration, but one or more of the individual devices within the first uniform transistor-based component may be different from other devices of the first uniform transistor-based component. For example, a first uniform transistor-based component may include a first device having a first design/type (e.g., a first transistor die) and a second device having a second device/type (e.g., a first IPD device) and a second transistor-based component may include a same first device having the first design/type (e.g., the first transistor die) and the second device having the second device/type (e.g., the first IPD device). In some embodiments, the first devices used in the first and second uniform transistor-based components may be substantially the same (e.g., within manufacturing tolerances) and/or the second devices used in the first and second uniform transistor-based components may be substantially the same (e.g., within manufacturing tolerances). In other words, the uniform transistor-based component may be a "template" that includes one or more devices, where the "template" may be repeated a plurality of times within a package.

In some embodiments, respective transistor dies of a plurality of uniform transistor-based components may be considered uniform if, for example, they have a same gate periphery, a same power capacity, a same size, or the like. In some embodiments, respective transistor dies of a plurality of uniform transistor-based components may be considered uniform if they are the same and/or identical, within manufacturing tolerances. In some embodiments, respective IPD devices of a plurality of uniform transistor-based components may be considered uniform if, for example, they have a same layout of a same collection of devices, a same harmonic termination and/or impedance matching capability, a same size, or the like. In some embodiments, respective IPD devices of a plurality of uniform transistor-based components may be considered uniform if they are the same and/or identical, within manufacturing tolerances.

In addition, as used herein, the respective uniform transistor-based components may be considered "uniform" even though respective ones of the uniform transistor-based components have different bondwire configurations. In other words, a first uniform transistor-based component and a second uniform transistor-based component are considered uniform if they include a same number and type of devices arranged in a same configuration, but bondwires interconnecting the devices of the first uniform transistor-based component are different, for example, in number, type, and/or arrangement, than the second uniform transistor-based component. Stated another way, uniform transistor-based components are considered uniform if they include a same number and type of devices physically arranged in a same configuration, regardless of the bondwire connections used between respective ones of the devices of the uniform transistor-based component. In some embodiments, each uniform transistor-based component may include a transistor die. In some embodiments, each uniform transistor-based component may also include one or more IPD circuits (where each uniform transistor-based component includes the same number and type(s) of IPD circuits). A transistor package may then be generated by mounting a plurality of the uniform transistor-based components on a submount within a package and using bondwires to interconnect the uniform transistor-based components.

As previously described, semiconductor packages may include transistor dies coupled to harmonic termination circuits and/or impedance matching circuits (which are collectively referred to herein as "matching circuits"). The harmonic termination circuits and impedance matching circuits may be implemented, for example, using integrated passive device (IPD) circuits. The IPD circuits may include, for example, a substrate such as a ceramic substrate (e.g., an alumina substrate) or a printed circuit board that has capacitors, inductors and/or resistors formed thereon. In some embodiments of the present disclosure, bondwires may be coupled (1) between the IPD circuits and the input/output of the package, (2) between the IPD circuits and the transistor die, (3) between the IPD circuits, and (4) between portions of the IPD circuits and tunable elements of the IPD circuits. These bondwires may act as inductors, and capacitors may be formed as part of the IPD circuits so that, for example, an inductor-capacitor-inductor (LCL) reactive circuit may be formed at the input and/or output of the transistor die.

In order to serve as an impedance matching device, an IPD circuit may need to be configured to match an input (in the case of an input impedance matching circuit) or an output (in the case of an output impedance matching circuit) of the packaged amplifier. Similarly, in order to serve as a harmonic termination circuit, an IPD circuit may need to be configured based on the fundamental operating frequency of the packaged amplifier. As a result, the IPD circuits may need to be tuned for a particular environment in which the packaged amplifier is expected to operate (e.g., with respect to the input impedance, output impedance, operating frequency and/or other factors).

In some embodiments, the IPD circuit may be additionally simplified. In semiconductor packages having a plurality of different types of amplifiers (e.g., for asymmetric amplifiers), the transistor dies often have different sizes. The use of different die sizes may create different values for the parasitic components of the die (e.g., parasitic capacitance, parasitic inductance, and the like), and hence the characteristics of the impedance matching networks may need to be optimized based on the types of transistor dies included in a particular product. By using a uniform transistor-based component, multiple copies of a given matching network may be created using substantially the same underlying components, both in terms of type and physical layout. While the matching component sizes of the IPD circuits are the same, a tunable component may be added to the IPD circuit to allow the network to be modifiable to work across many different power levels. As a result, the IPD circuits (e.g., the matching network), which previously may have required many different-sized IPD dies that were mounted in the package using die bonding (often using a different die bonding machine for each different sized die), may be implemented using multiple instances of a single uniform transistor-based component that includes multiple IPD dies. Utilizing bondwires, which may be easily modified during fabrication, the type of product that is manufactured may be varied based primarily and/or solely on bondwire variation. The embodiments described herein may allow for the significant reduction of a need to change wafers to accommodate different dies during the manufacture of a given semiconductor package and/or between semiconductor packages.

Implementing amplifier packages using a plurality of uniform transistor-based components may be particularly advantageous with respect to the manufacture of asymmetric amplifiers (i.e., amplifiers that include multiple paths having different gains and/or performance characteristics), as these amplifiers have conventionally tended to include a number of different dies that have different sizes. There are also cost benefits that may be gained due to the use of the uniform transistor-based component in manufacturing semiconductor devices. For example, design time, production cost, and/or production time may be lower as it may not be necessary to design and/or process masks for multiple different sized dies. As an additional example, it may not be necessary to utilize one wafer with two different sized die on it, which may avoid complexity that is generated in assembly and test (i.e., tracking different designs on a wafer in mass production). The use of uniform transistor-based components may also reduce cost due to the use of an increased wafer quantity of same wafers (e.g., due to the increased use of common dies). The use of uniform transistor-based components may also reduce cost by removing process variation, as the uniform die may be picked from a physically similar location on a wafer instead of from two separate wafers. The use of uniform transistor-based components may also reduce cost by reducing manufacturing complexity when assembling multiple dies. For example, the use of uniform transistor-based component may mean no or fewer changeovers in moving from one wafer to a different wafer in order to bond the die down. In addition, there is increased interest in larger wafer sizes. Embodiments described herein may drive down the individual die cost significantly by increasing wafer density, and may improve assembly time by reducing complexity. As a result, there is a benefit to both cost and assembly throughput using the embodiments of the present disclosure.

Amplifier packages according to embodiments of the present disclosure include a plurality of uniform transistor-based components in order to use a fewer number of different die/components as compared to conventional devices. The embodiments described herein expand on the concept of symmetry through splitting and combining architectures and enable architecturally simple asymmetric amplifier design. The embodiments of the present disclosure provide an advantage by limiting the differences in physical geometry internal to an amplifier package between products of different specific requirements like output power level and frequency, for instance.

In addition, by enabling a higher repetition in the uniform dies/chips that are used to form a device package, embodiments of the present disclosure allow for more of a same type of chip to be bonded to a submount of the package before a wafer used to source the dies/chips is changed during manufacturing (e.g., by a bonding machine). By sourcing more of the dies/chips from a same wafer, the likelihood that the uniform dies/chips of a package are taken from physically proximate locations on the wafer is increased. This feature may provide the additional benefit of reducing variations between chips/dies of the package, because physically proximate dies/chips will often exhibit the same performance levels and fewer variations that might be caused due to fabrication characteristics (e.g., doping levels, etching patterns) that might vary across a wafer. Thus, using configurations that increase the number of same chips/dies being used may lead to less performance variance between individual ones of the dies/chips.

Figure 1B:
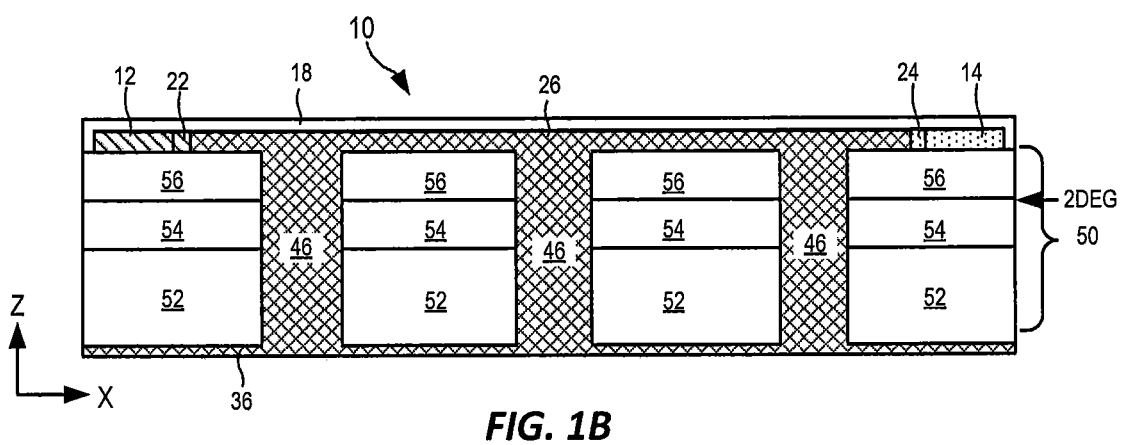
Figure 1C:
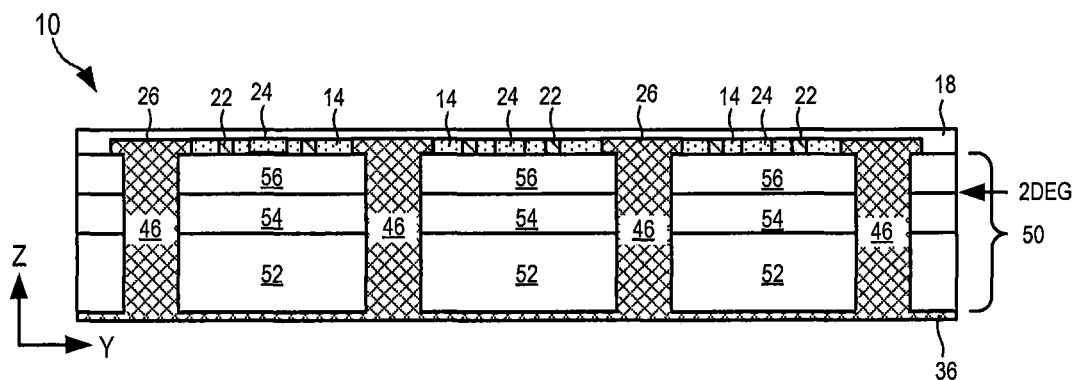

As discussed above, packaged amplifiers are disclosed herein that are formed using a plurality of uniform transistor-based components, where each uniform transistor-based component may include a transistor die and/or one or more IPD circuits. The transistor die may, for example, be a Group III nitride-based transistor amplifier, but the present disclosure is not limited thereto. FIGS. 1A-1C schematically illustrate the design of a representative Group III nitride-based transistor that may be included in uniform transistor-based components according to embodiments of the present disclosure. In particular, FIG. 1A is a schematic plan view of the transistor die 10. In FIG. 1A, most of the metallization that is on the top surface of the semiconductor layer structure has been removed to illustrate the metallization that directly contacts the semiconductor layer structure of transistor die 10. FIGS. 1B and 1C are schematic cross-sectional views of the transistor die 10 taken along lines 1B-1B and 1C-1C of FIG. 1A, respectively. It will be appreciated that FIGS. 1A-1C (and many of the other figures of the present application) are highly simplified diagrams, and that actual transistor dies may include many more unit cells and various circuitry and elements that are not shown in the simplified figures herein.

As shown in FIG. 1A, the transistor die 10 includes a top side metallization structure 15 that is formed on a semiconductor layer structure 50. The top side metallization structure 15 includes a gate bus 12 and a drain bus 14, a plurality of gate fingers 22, a plurality of drain fingers 24 and a plurality of source fingers 26, all of which are formed on an upper surface of the semiconductor layer structure 50. The gate fingers 22, drain fingers 24 and source fingers 26 may extend in parallel to each other, with the gate fingers 22 extending from the gate bus 12 in a first direction and the drain fingers 24 extending from the drain bus 14 in a direction opposite the first direction. Each gate finger 22 may be positioned between a drain finger 14 and a source finger 26.

The gate bus 12 and the gate fingers 22 may be implemented as a first monolithic metal pattern. The gate bus 12 and the gate fingers 22 are part of a gate electrode structure of the transistor die 10. The upper portion (not shown) of the gate electrode may act as the first terminal 122 (see FIGS. 1D to 1F) of the transistor die 10 (also referred to herein as a first bonding pad and/or gate terminal). A first circuit element (not shown) may be connected to the gate terminal 122 by, for example, bondwires (not shown). The first circuit element may pass an input signal that is to be amplified to the transistor die 10.

Figure 1D:
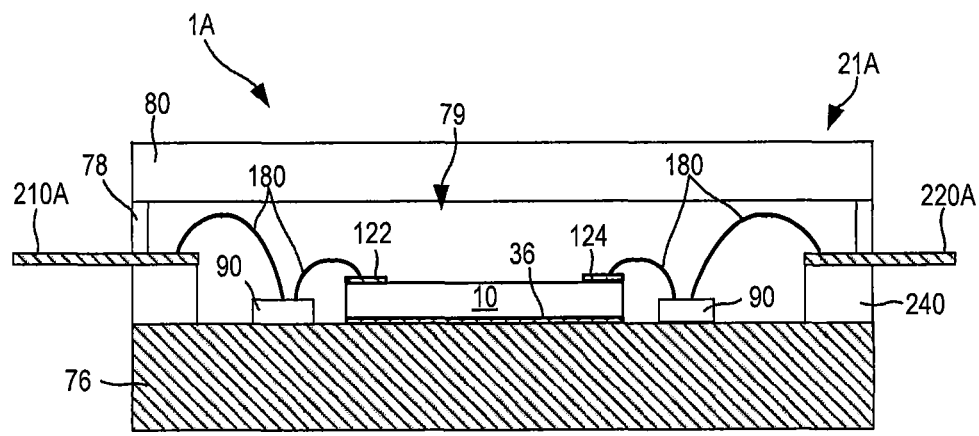
FIGS. 1D through 1F are schematic cross-sectional views illustrating several example ways that that the transistor dies according to some embodiments of the present disclosure may be packaged to provide packaged transistors.
Figure 1E:
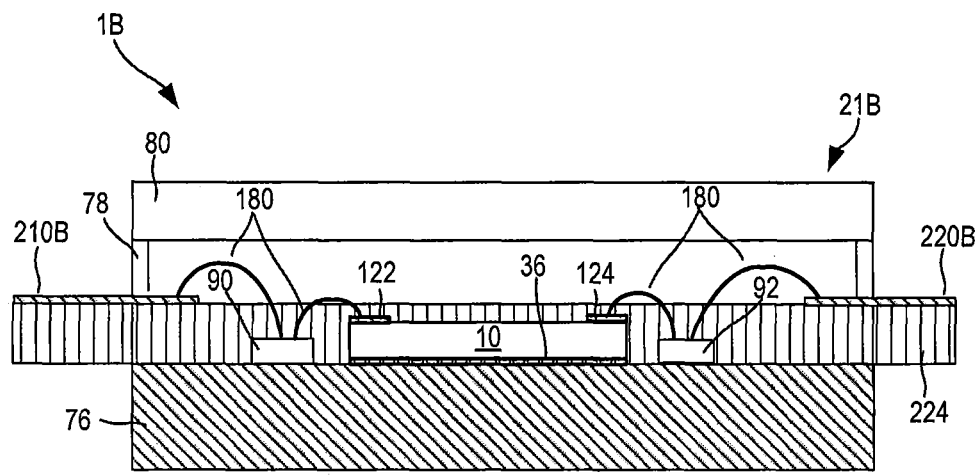
Figure 1F:
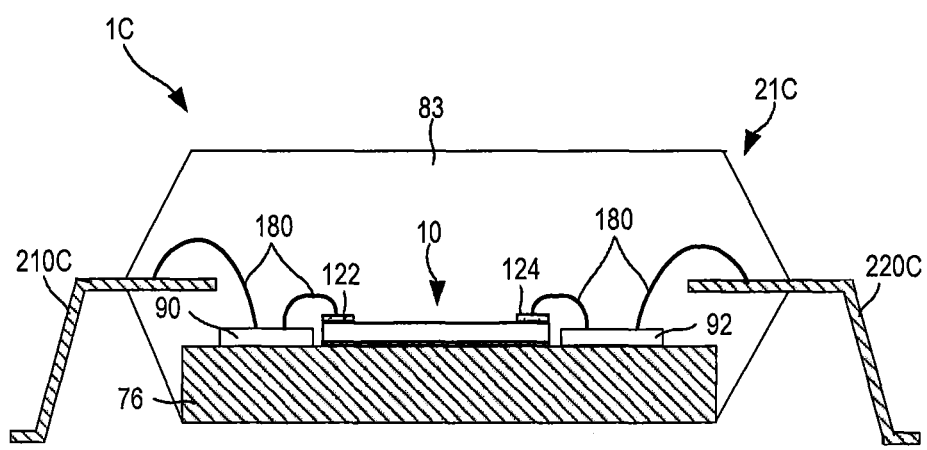

The drain bus 14 and the drain fingers 24 may be implemented as a second monolithic metal pattern. The drain bus 14 and the drain fingers 24 are part of a drain electrode of the transistor die 10. The upper portion (not shown) of the drain electrode may act as a second terminal 124 (see FIGS. 1D to 1F) of the transistor die 10 (also referred to herein as a second bonding pad and/or drain terminal). A second circuit element (not shown) may be connected to the drain terminal 124 by, for example, bondwires (not shown). The second circuit element may receive an amplified signal that is output by the transistor die 10. The gate and drain terminals 122, 124 are not shown in FIG. 1A, but are schematically depicted in FIGS. 1D to 1F.

The source fingers 26 are physically and electrically connected to a source terminal 36 of the transistor die 10 that is located on the bottom side of the semiconductor layer structure 50 by a plurality of metal-plated source vias 46. Each metal-plated source via 46 may extend from the top metallization structure 15 through the semiconductor layer structure 50. Each metal-plated source via 46 may each be implemented by forming openings though the semiconductor layer structure 50 (e.g., by anisotropic etching) and by then depositing metal-plating that coats (or, alternatively, fills) the sidewalls of the openings.

One or more interlayer insulating layers 18 (see FIG. 1B) are formed that isolate the gate metallization 12, 22, the drain metallization 14, 24 and the source metallization 26 from each other. The interlayer insulating layer(s) 18 may include a dielectric material, such as SiN, SiO$_2$, etc.

The transistor die 10 includes a plurality of unit cell transistors 102, one of which is indicated in the dashed box in FIG. 1A. The unit cell transistor 102 includes a gate finger 22, a portion of a drain finger 24 and a portion of a source finger 26 along with the portions of the semiconductor layer structure 50 underlying the identified gate finger 22, drain finger 24 and source finger 26. Since all of the gate fingers 22 are electrically connected to a common gate bus 12, all of the drain fingers 24 are electrically connected to a common drain bus 14, and all of the source fingers 26 are electrically connected to a common source terminal 36, it can be seen that the unit cell transistors 102 are all electrically connected together in parallel. The transistor die 10 may comprise a Group III nitride-based HEMT transistor amplifier.

FIGS. 1B and 1C illustrate the semiconductor layer structure 50 in more detail. As shown in FIGS. 1B and 1C, the semiconductor layer structure 50 includes a plurality of semiconductor layers. In the depicted embodiment, a total of two semiconductor layers are shown, namely a channel layer 54 and a barrier layer 56 that is on a top side of the channel layer 54. The semiconductor layer structure 50 may (and typically will) include additional semiconductor and/or non-semiconductor layers. For example, the semiconductor layer structure 50 may include a growth substrate 52 on which the other semiconductor layers are grown. The growth substrate 52 may comprise, for example, a 4H—SiC or 6H—SiC substrate. In other embodiments, the growth substrate 52 may be comprise a different semiconductor material (e.g., silicon or a Group III nitride-based material, GaAs, ZnO, InP) or a non-semiconductor material (e.g., sapphire). The growth substrate 52, even if formed of a non-semiconductor material, is considered to be part of the semiconductor layer structure 50.

Optional buffer, nucleation and/or transition layers (not shown) may be provided on the growth substrate 52 beneath the channel layer 54. For example, an AlN buffer layer may be included to provide an appropriate crystal structure transition between a SiC growth substrate 52 and the remainder of the semiconductor layer structure 50. Additionally, strain balancing transition layer(s) may also be provided.

In some embodiments, the channel layer 54 is a Group III nitride material, such as $Al_xGa_{1-x}N$ where $0 \leq x < 1$, provided that the energy of the conduction band edge of the channel layer 54 is less than the energy of the conduction band edge of the barrier layer 56 at the interface between the channel and barrier layers 54, 56. In certain embodiments of the present disclosure, x=0, indicating that the channel layer 54 is gallium nitride ("GaN"). The channel layer 54 may also be other Group III nitrides such as InGaN, AlInGaN or the like. The channel layer 54 may be undoped or unintentionally doped and may be grown to a thickness of, for example, greater than about 20 Å. The channel layer 54 may also be a multi-layer structure, such as a superlattice or combinations of GaN, AlGaN or the like.

The channel layer 54 may have a bandgap that is less than the bandgap of at least a portion of the barrier layer 56, and the channel layer 54 may also have a larger electron affinity than the barrier layer 56. In certain embodiments, the barrier layer 56 is MN, AlInN, AlGaN or AlInGaN with a thickness of between about 0.1 nm and about 10 nm or more. In particular embodiments, the barrier layer 56 is thick enough and has a high enough Al composition and doping to induce a significant carrier concentration at the interface between the channel layer 54 and the barrier layer 56.

The barrier layer 56 may be a Group III nitride and may have a bandgap larger than that of the channel layer 54 and a smaller electron affinity than the channel layer 54. Accordingly, in certain embodiments of the present disclosure, the barrier layer 56 may include AlGaN, AlInGaN and/or AlN or combinations of layers thereof. The barrier layer 56 may, for example, be from about 0.1 nm to about 30 nm thick. In certain embodiments, the barrier layer 56 is undoped or doped with an n-type dopant to a concentration less than about $10^{19}$ cm$^{-3}$. In some embodiments of the present disclosure, the barrier layer 56 is $Al_xGa_{1-x}N$ where 0<x<1.

Due to the difference in bandgap between the barrier layer 56 and the channel layer 54 and piezoelectric effects at the interface between the barrier layer 56 and the channel layer 54, a two-dimensional electron gas (2DEG) is induced in the channel layer 54 at a junction between the channel layer 54 and the barrier layer 56. The 2DEG acts as a highly conductive layer that allows conduction between the source region of each unit cell transistor 102 and its associated drain region, where the source region is the portion of the semiconductor layer structure 50 that is directly underneath the source finger 26 and the drain region is the portion of the semiconductor layer structure 50 that is directly underneath the corresponding drain finger 24.

FIGS. 1D through 1F are schematic cross-sectional views illustrating several example ways that that the transistor dies according to embodiments of the present disclosure may be packaged to provide packaged transistors 1A through 1C, respectively. While FIGS. 1D-1F show the transistor die 10 of FIGS. 1A-1C being packaged, it will be appreciated that any of the transistor dies and device components according to embodiments of the present disclosure may be packaged in the packages illustrated in FIGS. 1D-1F, as well as other packages that would be understood by those of ordinary skill in the art.

FIG. 1D is a schematic side view of a packaged Group III nitride-based transistor 1A. As shown in FIG. 1D, packaged transistor 1A includes the transistor die 10 packaged in an open cavity package 21A. The package 21A includes metal gate leads 210A, metal drain leads 220A, a metal submount 76, sidewalls 78 and a lid 80.

The submount 76 may include materials configured to assist with the thermal management of the package 21A. For example, the submount 76 may include copper and/or molybdenum. In some embodiments, the submount 76 may be composed of multiple layers and/or contain vias/interconnects. In an example embodiment, the submount 76 may be a multilayer copper/molybdenum/copper metal flange that comprises a core molybdenum layer with copper cladding layers on either major surface thereof. In some embodiments, the submount 76 may include a metal heat sink that is part of a lead frame or metal slug. The sidewalls 78 and/or lid 80 may be formed of or include an insulating material in some embodiments. For example, the sidewalls 78 and/or lid 80 may be formed of or include ceramic materials. In some embodiments, the sidewalls 78 and/or lid 80 may be formed of, for example, $Al_2O_3$. The lid 80 may be glued to the sidewalls 78 using an epoxy glue. The sidewalls 78 may be attached to the submount 76 via, for example, braising. The gate lead 210A and the drain lead 220A may be configured to extend through the sidewalls 78, though embodiments of the present disclosure are not limited thereto.

The transistor die 10 is mounted on the upper surface of the metal submount 76 in an air-filled cavity 79 defined by the metal submount 76, the ceramic sidewalls 78 and the ceramic lid 80. As described above, the gate and drain terminals 122, 124 of transistor die 10 are on the tip side of the semiconductor layer structure 50, while the source terminal 136 is on the bottom side of the semiconductor layer structure 50. The source terminal 36 may be mounted on the metal submount 76 using, for example, a conductive die attach material (not shown). The metal submount 76 may provide the electrical connection to the source terminal 36 and may also serve as a heat dissipation structure that dissipates heat that is generated in the transistor die 10. The heat is primarily generated in the upper portion of the transistor die 10 where relatively high current densities are generated in, for example, the channel regions of the unit cell transistors 102. This heat may be transferred though the source vias 46 and the semiconductor layer structure 50 to the source terminal 36 and then to the metal submount 76.

Input matching circuits 90 and/or output matching circuits 92 may also be mounted within the package. The matching circuits 90, 92 may include impedance matching and/or harmonic termination circuits. The impedance matching circuits may be used to match the impedance of the fundamental component of signals that are input to or output from the packaged transistor 1A to the impedance at the input or output of the transistor die 10, respectively. The harmonic termination circuits may be used to ground harmonics of the fundamental signal that may be present at the input or output of the transistor die 10. More than one input matching circuit 90 and/or output matching circuit 92 may be provided. As schematically shown in FIG. 1D, the input and output matching circuits 90, 92 may be mounted on the metal submount 76. The gate lead 210A may be connected to the input matching circuit 90 by one or more bondwires 180, and the input matching circuit 90 may be connected to the gate terminal 122 of transistor die 10 by one or more additional bondwires 180. Similarly, the drain lead 220A may be connected to the output matching circuit 92 by one or more bondwires 180, and the output matching circuit 92 may be connected to the drain terminal 124 of transistor die 10 by one or more additional bondwires 180. The bondwires 180, which are inductive elements, may form part of the input and/or output matching circuits.

FIG. 1E is a schematic side view of a packaged Group III nitride-based transistor 1B that includes the transistor die 10 of FIGS. 1A-1C packaged in a printed circuit board-based package 21B. The packaged transistor 1B is very similar to the packaged transistor 1A of FIG. 1D, except that the gate and drain leads 210A, 220A of package 21A are replaced with printed circuit board-based leads 210B, 220B in package 21B.

The package 21B includes a submount 76, ceramic sidewalls 78, a ceramic lid 80, each of which may be substantially similar to the like numbered elements of package 21A discussed above. The package 21B further includes a printed circuit board 224. Conductive traces on the printed circuit board 224 form a metal gate lead 210B and a metal drain lead 220B. The printed circuit board 224 may be attached to the submount 76 via, for example, a conductive glue. The printed circuit board 76 includes a central opening and the transistor die 10 is mounted within this opening on the submount 76. Other components of packaged transistor 1B may be the same as the like-numbered components of packaged transistor 1A, and hence further description thereof will be omitted.

FIG. 1F is a schematic side view of another packaged Group III nitride-based transistor 1C. Packaged transistor 1C differs from packaged transistor 1A in that it includes a different package 21C. The package 21C includes a metal submount 76 (which may be similar or identical to the like numbered submount 76 of package 21A), as well as metal gate and drain leads 210C, 220C. Packaged transistor 1C also includes a plastic overmold 83 that at least partially surrounds the transistor die 10, the leads 210C, 220C, and the metal submount 76. Other components of packaged transistor 1C may be the same as the like-numbered components of packaged transistor 1A and hence further description thereof will be omitted.

Fabrication of the transistor die 10 may include the formation of a plurality (e.g., hundreds or thousands) of the transistor die 10 on a wafer. Individual ones of the transistor dies 10 may be later singulated from the wafer and placed within a device package, such as the packages 1A-1C illustrated in FIGS. 1D to 1F.

Figure 2:
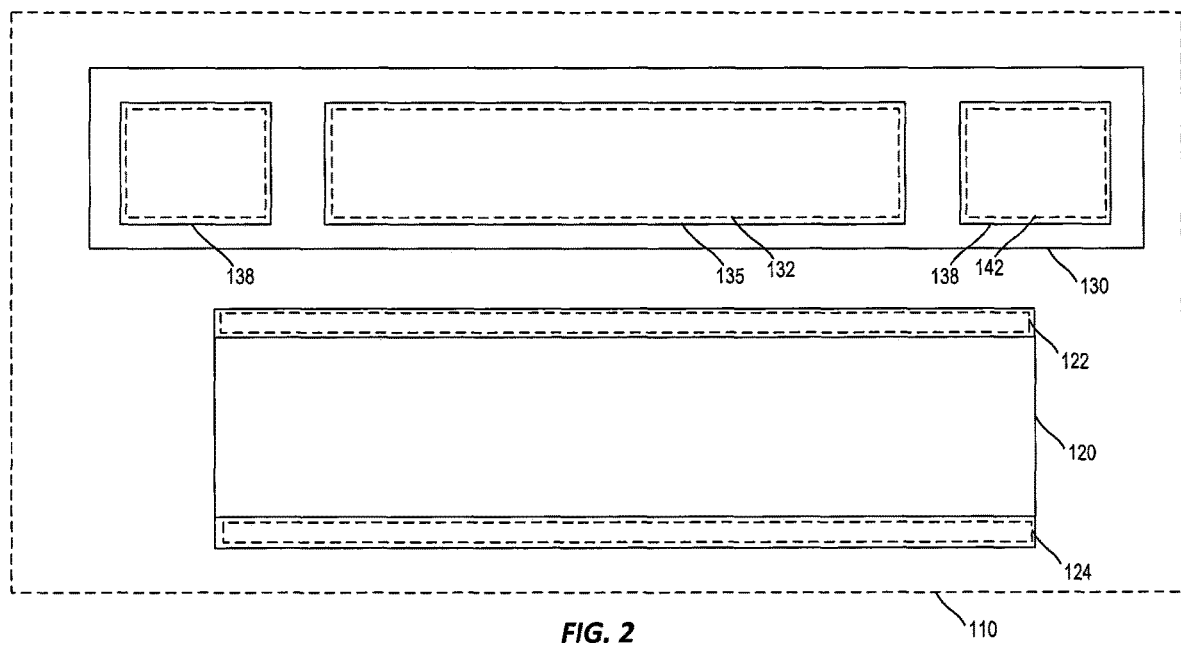
FIG. 2 is a schematic diagram of a uniform transistor-based component, according to some embodiments of the present disclosure.

FIG. 2 is a schematic diagram of a uniform transistor-based component 110, according to some embodiments of the present disclosure. The uniform transistor-based component 110 may include a number of discrete devices. The devices of the uniform transistor-based component 110 may include a transistor die 120 and an IPD circuit 130.

In some embodiments, the transistor die 120 may be a Group III nitride-based transistor amplifier, such as that illustrated in FIGS. 1A to 1C, but the embodiments of the present disclosure are not limited thereto. In some embodiments, the transistor die 120 may be field effect transistor (FET), such as metal-oxide-semiconductor FET (MOSFET). The transistor die 120 may be referred to herein as both a transistor and a transistor die. The transistor die 120 may have any type of configuration. In some embodiments, the transistor die 120 may have an average output power of 20 W or less. In some embodiments, the transistor die 120 may have an average output power of 10 W or less. In some embodiments, the transistor die 120 may have a total gate periphery of 15 mm or less. In some embodiments, the transistor die 120 may have a total gate periphery of 10 mm or less.

The transistor die 120 may include bonding surfaces to which bondwires may be attached. For example, the transistor die 120 may have a first bonding pad 122 and a second bonding pad 124. In some embodiments, the first bonding pad 122 may be on a first side (e.g., an input side or gate side) of the transistor die 120 and the second bonding pad 124 may be on a second side (e.g., an output side or drain side) of the transistor die 120. In some embodiments, the first bonding pad 122 may be coupled to gates of the transistor cells of the transistor die 120 that are part of the die of the transistor die 120 and/or the second bonding pad 124 may be coupled to drains of the transistor cells of the transistor die 120 that are part of the die of the transistor die 120, but the present disclosure is not limited thereto.

The IPD circuit 130 may include a main IPD element 135 and one or more tunable IPD elements 138. The main IPD element 135, for example, may include one more capacitor circuits or other circuit elements. The main IPD element 135 may provide, for example, impedance matching and/or harmonic termination functionality. The tunable IPD elements 138 may include additional capacitor circuits or other circuit elements. As will be described further herein, the tunable IPD elements 138 may be configured to provide tunable functionality to the IPD circuit 130.

The IPD circuit 130 may include bonding surfaces to which bondwires may be attached. For example, the main IPD element 135 may have a bonding pad 132. In some embodiments, the bonding pad 132 may be on an upper surface of the main IPD element 135 and may couple to IPD circuit elements (e.g., capacitors) in the main IPD element 135. Each tunable IPD element 138 may have a bonding pad 142. In some embodiments, the bonding pad 142 may be on an upper surface of the tunable IPD element 138 and may couple to IPD circuit elements (e.g., capacitors) in the tunable IPD element 138.

Bondwires may be used to electrically connect the IPD circuit 130 to the transistor die 120 (e.g., bondwires extending from the bonding pad 132 of the main IPD element 135 to first bonding pad 122 of the transistor die 120). Additional bondwires may be provided that electrically connect a first external circuit to the uniform transistor-based component 110 (e.g., bondwires extending from an input lead to the bonding pad 132 of the main IPD element 135) and/or that electrically connect a second external circuit to the uniform transistor-based component 110 (e.g., bondwires extending from the second bonding pad 124 of the transistor die 120 to an output lead).

The IPD circuit 130 may provide, for example, impedance matching and/or harmonic termination to the transistor die 120. The configuration of the impedance matching and/or harmonic termination may be adjusted by varying the type and/or configuration of the bondwires. In some embodiments, the impedance matching and/or harmonic termination may be further adjusted by electrically coupling one or more of the tunable IPD elements 138 to the main IPD element 135. For example, bondwires may be coupled between the bonding pad 132 of the main IPD element 135 and one or more of the bonding pads 142 of a tunable IPD element 138.

Figure 3A:
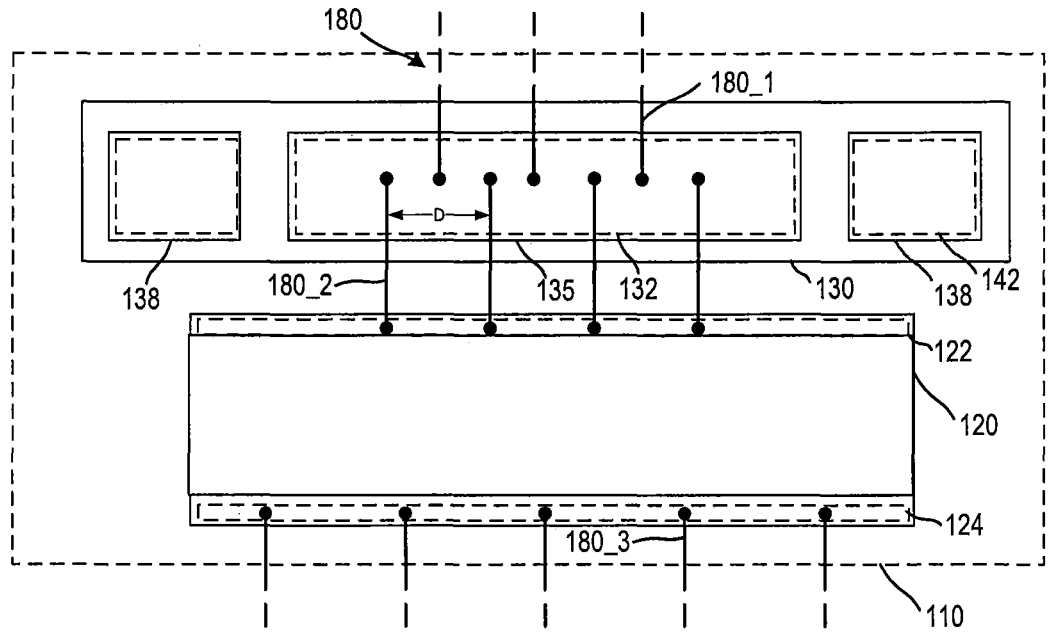
FIGS. 3A and 3B illustrate examples of bondwire attachments to and within a uniform transistor-based component, according to some embodiments of the present disclosure.
Figure 3B:
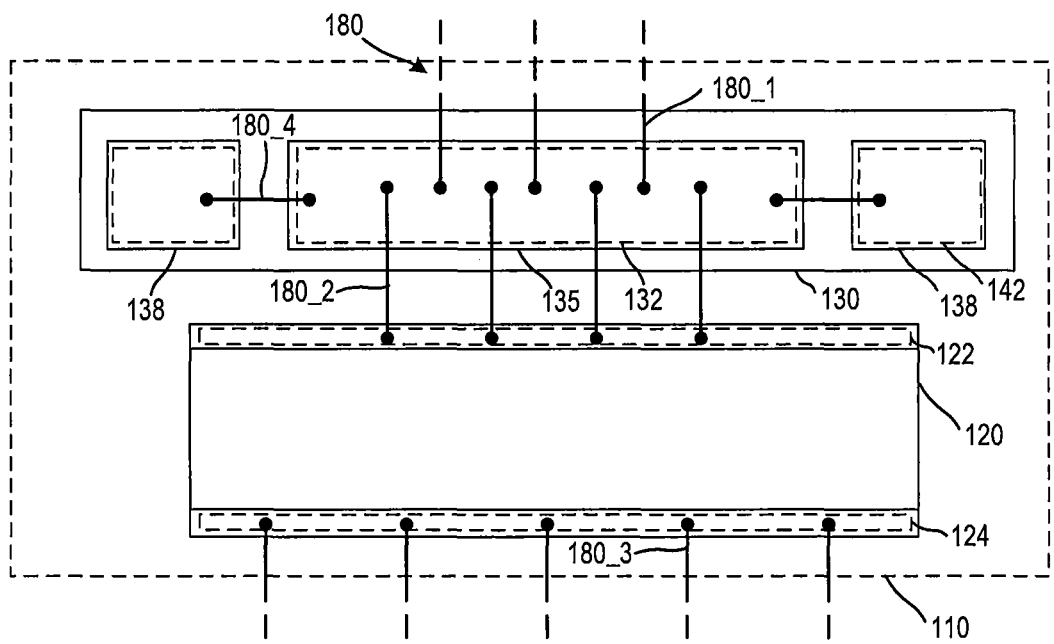

FIGS. 3A and 3B illustrate examples of bondwire attachments to and within a uniform transistor-based component 110, according to some embodiments of the present disclosure. Referring to FIG. 3A, a plurality of bondwires 180 may be coupled to the uniform transistor-based component 110. For example, first bondwires 180_1 may be coupled from another circuit element or other portion of the package (e.g., from an input lead) to the bonding pad 132 of the main IPD element. The number of first bondwires 180_1 illustrated in FIG. 3A is merely an example and not intended to limit the present disclosure. Varying a number and profile of the first bondwires 180_1 may vary, for example, a current carrying capability of the uniform transistor-based component 110 and/or an impedance of the IPD circuit 130.

Second bondwires 180_2 may be coupled between the bonding pad 132 of the main IPD element 135 and first bonding pad 122 of the transistor die 120. As a result, the IPD circuit 130 may be electrically connected to the transistor die 120. The number of second bondwires 180_2 illustrated in FIG. 3A is merely an example and not intended to limit the present disclosure. Varying a number and profile of the second bondwires 180_2 may vary, for example, a current carrying capability of the uniform transistor-based component 110 and/or an impedance of the IPD circuit 130.

Third bondwires 180_3 may be coupled from the second bonding pad 124 of the uniform transistor-based component 110 to another circuit element or other portion of the package (e.g., to an output lead). The number of third bondwires 180_3 illustrated in FIG. 3A is merely an example and not intended to limit the present disclosure. Varying a number and profile of the third bondwires 180_3 may vary, for example, a current carrying capability of the uniform transistor-based component 110.

The bondwires 180 may be spaced apart from one another by a distance D. The distance D between adjacent ones of the bondwires 180 need not be uniform. For example, the distance D between adjacent ones of the first bondwires 180_1, the second bondwires 180_2, and/or the third bondwires 180_3 may vary throughout the uniform transistor-based component 110. In addition, a distance between adjacent ones of the first bondwires 180_1 may be different than that of the second bondwires 180_2, and/or the third bondwires 180_3.

FIG. 3B illustrates a similar configuration to that of FIG. 3A with the addition of fourth bondwires 180_4 between the bonding pad 132 of the main IPD element 135 and one or more of the bonding pads 142 of the tunable IPD elements 138. The number of fourth bondwires 180_4 illustrated in FIG. 3B is merely an example and not intended to limit the present disclosure. Varying a number and profile of the fourth bondwires 180_4 may vary, for example, an impedance and/or capacitance of the IPD circuit 130. By adding fourth bondwires 180_4, one or more of the tunable IPD elements 138 may be coupled into the IPD circuit 130. For example, a capacitance of the IPD circuit 130 may be increased by a first amount by coupling a first of the tunable IPD elements 138 to the main IPD element 135 and the capacitance of the IPD circuit 130 may be increased by a second amount by additionally coupling a second of the tunable IPD elements 138 to the main IPD element 135. Though only two tunable IPD elements 138 are illustrated in FIGS. 3A and 3B, it will be understood that more or fewer tunable IPD elements 138 may be present without deviating from the present disclosure. The amount of capacitance added by each tunable IPD element 138 may differ to increase the number of possible capacitances added by the IPD circuit 130.

Referring to FIGS. 3A and 3B, it can be seen that the uniform transistor-based component 110 offers a number of configuration options that may be made using a common format with a finite set of devices. For example, the number and profile of the bondwires 180 may be adjusted to change the characteristics of the device. In addition, one or more of the tunable IPD elements 138 may be selectively connected to further adjust the characteristics of the device. In this way, using a uniform transistor-based component 110, a plurality of packages with different characteristics may be fabricated by only adjusting the configuration of the bondwires 180 (e.g., by providing various bondwire configurations to a configurable semiconductor device platform). The use of fewer discrete components reduces variation in the fabrication process, resulting in a reduction in complexity and cost. By reusing a finite number of die configurations across a package, the number of wafer transfers in the die bond process may be reduced. Furthermore, using a smaller number of dies across the package pins may allow for the fabrication process to increase the frequency at which dies are selected from a same wafer and from the same or proximate spot on the wafer. Thus, the dies within the package may have similar wafer process variation, as the dies will be from locations that may be physically close to one another.

FIGS. 4A to 4F are schematic illustrations of example configurations that may be used to vary the physical characteristics of a uniform transistor-based component 110, according to some embodiments of the present disclosure.

Figure 4A:
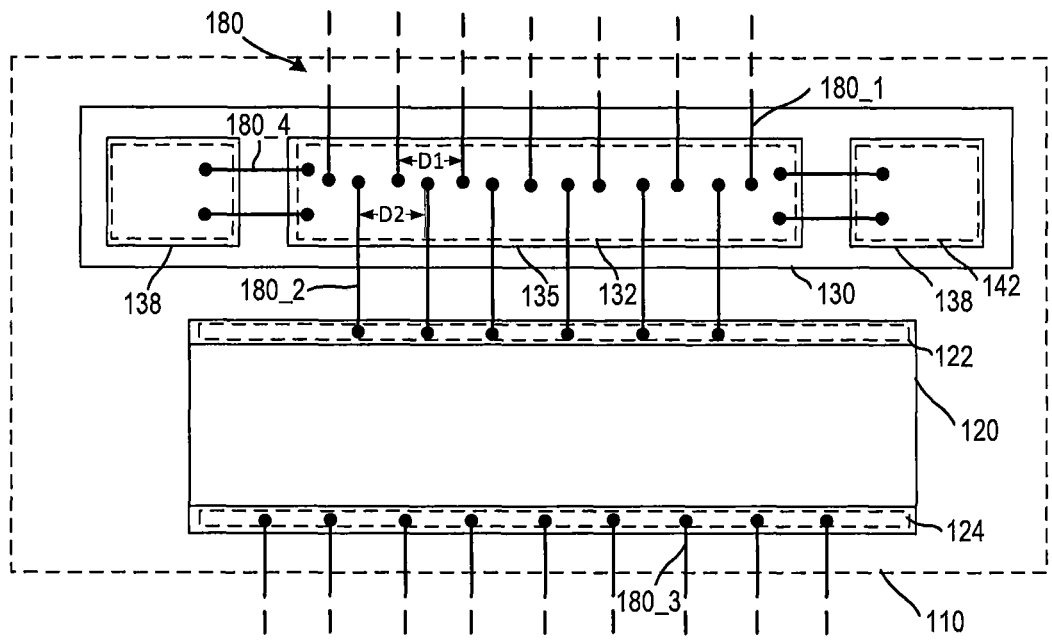
FIGS. 4A to 4F are schematic illustrations of example configurations that may be used to vary the physical characteristics of the uniform transistor-based component, according to some embodiments of the present disclosure.

Referring to FIG. 4A, the first bondwires 180_1 that connect to the IPD circuit 130 may have a first distance D1 between adjacent ones of the first bondwires 180_1. In some embodiments, the first distance D1 between adjacent ones of the first bondwires 180_1 may be adjusted to vary a mutual inductance between the first bondwires 180_1 and/or to adjust the number of first bondwires 180_1 that may be provided on the bonding pad (e.g., bonding pad 1320. The first distance D1 may be predetermined within manufacturing tolerance and applied to the uniform transistor-based component 110 during fabrication (e.g., to fabricate a semiconductor device having a particular characteristic, such as operating frequency or impedance matching). The first distance D1 may impact, for example, parasitic cancellation or reactance variation, such as an inductance of the IPD circuit 130, and may be used, for example, to establish a particular input impedance matching or input harmonic termination. Other characteristics of the semiconductor device that may be impacted by variations in the bondwire profile and/or configuration include modifications to the gain, linearity, and/or efficiency of the semiconductor device.

The second bondwires 180_2 between the IPD circuit 130 and the transistor die 120 may have a second distance D2 between adjacent ones of the second bondwires 180_2. As with the first bondwires 180_2, the second distance D2 may be predetermined within manufacturing tolerance to create a particular characteristic in the resulting package and may be applied to the uniform transistor-based component 110 during fabrication. The second distance D2 may also impact an inductance of the IPD circuit 130.

In addition to the configurations of the first and second bondwires 180_1, 180_2, the configurations of the third and fourth bondwires 180_3, 180_4 may also be varied. For example, FIG. 4A illustrates that the numbers of the third and fourth bondwires 180_3, 180_4 may be different as compared to the example configuration of FIG. 3B. Increasing the number of the fourth bondwires 180_4 between the main IPD element 135 and the tunable IPD element 138 may increase an inductance of the IPD circuit 130 as well as increase a current carrying capability of the device.

Figure 4B:
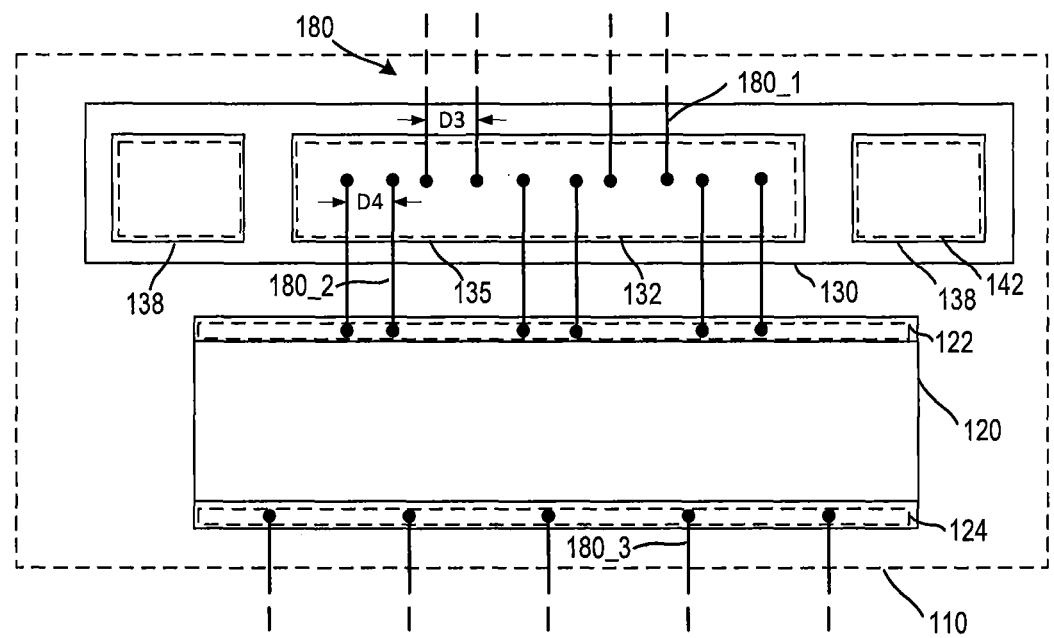
Figure 4C:
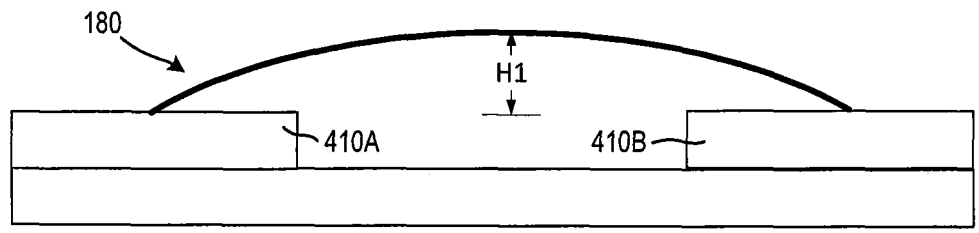

FIG. 4A illustrates that the first and second bondwires 180_1, 180_2 may alternate, but the present disclosure is not limited to such a configuration. FIG. 4B illustrates that one or more of the first and second bondwires 180_1, 180_2 may be arranged adjacent to one another. For example, in FIG. 4B the first bondwires 180_1 are arranged in pairs with a third distance D3 between them, and the second bondwires 180_2 are arranged in pairs with a fourth distance D4 between them. In some embodiments, the distances D3 and D4 may be different from one another. FIG. 4B also illustrates an embodiment in which third bondwires 180_3 are not provided between the main IPD element 135 and the tunable IPD elements 138, which may adjust the impedance matching and/or harmonic termination capability of the IPD circuit 130.

FIGS. 4A and 4B illustrate examples of the number of combinations that may be provided by the uniform transistor-based component 110 by varying the bondwire configuration. In many fabrication environments, the bondwire configuration is relatively less complicated to change than other aspects of the fabrication process. As a result, switching between device packages having different characteristics, such as operating frequency and impedance matching, may be relatively straight-forward.

In addition to the physical placement of the bondwires 180, FIGS. 4C to 4F illustrate mechanisms by which the characteristics of the uniform transistor-based component 110 may be altered by varying a profile of the bondwires 180. For example, referring to FIG. 4C, a bondwire 180 may be coupled between a first bonding surface 410A and a second bonding surface 410B. The first and second bonding surfaces 410A, 410B are intended to represent any of the bonding surfaces of the uniform transistor-based component 110. For example, the first bonding surface 410A may be the bonding pad 132 of the IPD circuit 130 and the second bonding surface 410B may be the first bonding pad 122 of the transistor die 120. FIGS. 4C to 4F are provided to illustrate examples of bonding configurations for the uniform transistor-based component 110 and are not intended to limit the present disclosure.

The bondwire 180 may extend a first height H1 over the first and/or second bonding surfaces 410A, 410B. The height H1 of the bondwire 180 may impact, for example, an impedance (e.g., an inductance) of the circuit to which the bondwire 180 is coupled. By varying a height H1 of the bondwire 180, which may also increase its length, the characteristic of the circuit to which the bondwire 180 is connected may be changed.

Figure 4D:
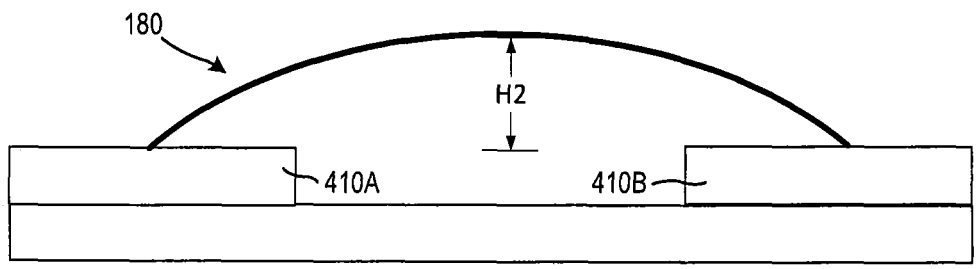

FIG. 4D illustrates an example in which the bondwire 180 extends at a second height H2 over the first and/or second bonding surfaces 410A, 410B. The second height H2 may be different than the first height H1. Comparing FIG. 4C to 4D, the characteristics of a device may be altered by varying a height of the bondwires.

Figure 4E:
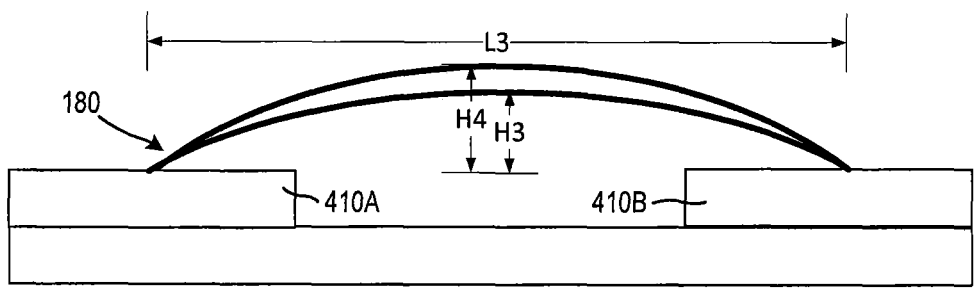

Referring to FIG. 4E, bondwires 180 may be provided at different heights within a same package. For example, a first bondwire 180 may extend a third height H3 over the first and/or second bonding surfaces 410A, 410B while a second bondwire 180 extends over the first and/or second bonding surfaces 410A, 410B at a fourth height H4, that is different from the third height H3. Providing bondwires 180 having different heights, which may include bondwires 180 of different lengths, may allow for more precise control of the impedance of the uniform transistor-based component 110.

In addition, FIG. 4E illustrates bondwires that extend between points on the first and/or second bonding surfaces 410A, 410B that are roughly a same distance apart. For example, the first bondwire 180 may extend from a first point on the first bonding surface 410A to a second point on the second bonding surface 410B. The first point on the first bonding surface 410A and the second bonding surface 410B may be a third distance L3 apart from one another (e.g., in a horizontal direction). The second bondwire 180 may extend from a third point on the first bonding surface 410A to a fourth point on the second bonding surface 410B. The third point on the first bonding surface 410A and the second bonding surface 410B may be the same third distance L3 apart from one another (e.g., in a horizontal direction). Thus, the bondwires 180 may extend between points that are approximately the same distance apart but at different heights.

Figure 4F:
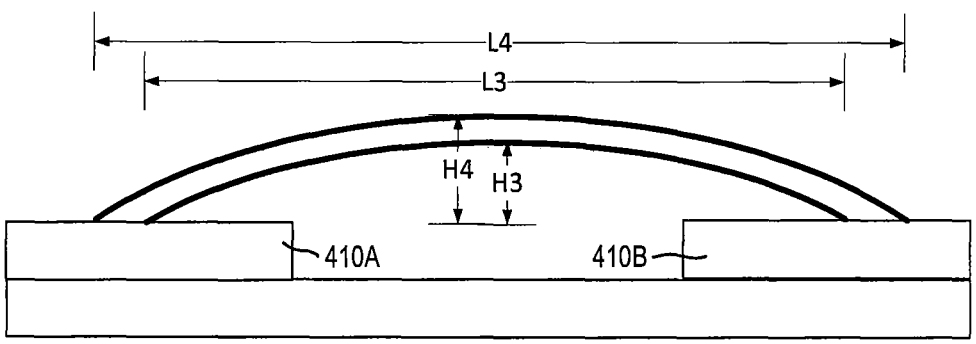

FIG. 4F illustrates an example in which the bondwires 180 extend between points that are different distances apart but at different heights. For example, the first bondwire 180 may extend from a first point on the first bonding surface 410A to a second point on the second bonding surface 410B at the third height H3 over the first and/or second bonding surfaces 410A, 410B. The first point on the first bonding surface 410A and the second bonding surface 410B may be the third distance L3 apart from one another (e.g., in a horizontal direction). The second bondwire 180 may extend from a third point on the first bonding surface 410A to a fourth point on the second bonding surface 410B at the fourth height H4 over the first and/or second bonding surfaces 410A, 410B. The third point on the first bonding surface 410A and the second bonding surface 410B may be a fourth distance L4 apart from one another (e.g., in a horizontal direction). The fourth distance L4 may be different from the third distance L3. By varying the length and/or height of the bondwires 180, the characteristics of the uniform transistor-based component 110 can be more precisely controlled.

The examples of FIGS. 4A to 4F are merely illustrative of the many configurations that are possible. As would be understood by one of ordinary skill in the art, a large number of combinations are possible, and an exhaustive list thereof would be burdensome. The configuration of the bondwires 180 may be adjustable in a number of factors including, but not limited to, the number of bondwires 180, the arrangement of the bondwires 180, the distance between adjacent bondwires 180, a profile of the bondwires 180, the type of bondwires 180, and other variations that would be understood by one of ordinary skill in the art.

Figure 5:
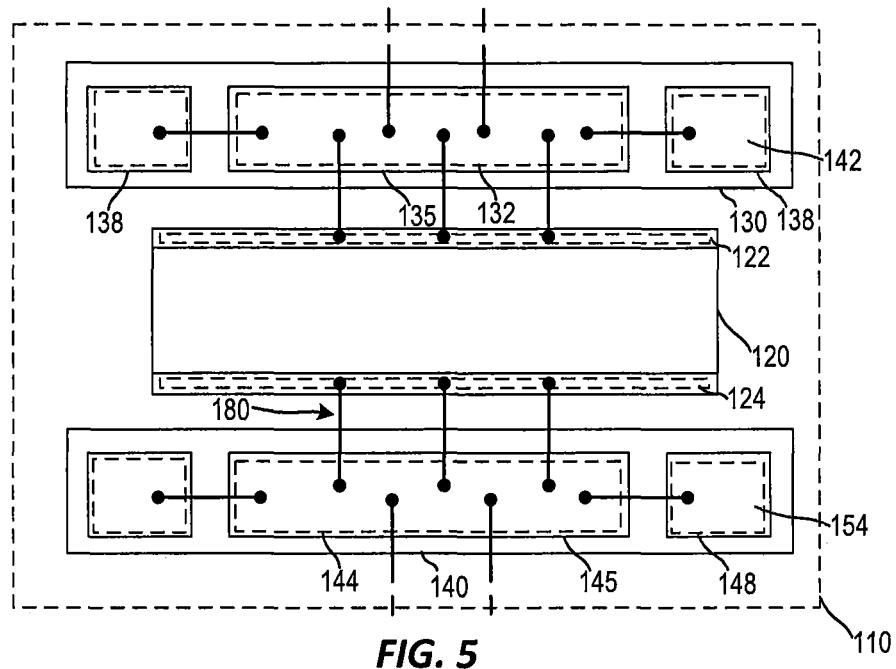
FIG. 5 illustrates an example embodiment of a uniform transistor-based component that includes a second IPD circuit, according to some embodiments of the present disclosure.

Embodiments of the uniform transistor-based component 110 of the present disclosure have been illustrated as having a single IPD circuit 130 in FIGS. 2 to 4F, but it will be understood that this is merely an example. FIG. 5 illustrates an example embodiment in which the IPD circuit 130 is a first IPD circuit 130 and the uniform transistor-based component 110 also includes a second IPD circuit 140, according to some embodiments of the present disclosure.

The second IPD circuit 140 may be structurally similar and/or identical to the first IPD circuit 130, though the present disclosure is not limited thereto. For example, the second IPD circuit 140 may include a main IPD element 145 and one or more tunable IPD elements 148. The main IPD element 145, for example, may include one more capacitor circuits or other circuit elements of the second IPD circuit 140. The main IPD element 145 may provide, for example, impedance matching and/or harmonic termination functionality. The tunable IPD elements 148 may include additional capacitor circuits or other circuit elements of the second IPD circuit 140. As described herein, the tunable IPD elements 148 may be configured to provide tunable functionality to the second IPD circuit 140.

The second IPD circuit 140 may include bonding surfaces to which bondwires 180 may be attached. For example, the main IPD element 145 of the second IPD circuit 140 may have a bonding pad 144. In some embodiments, the bonding pad 144 may be on an upper surface of the main IPD element 145 and may couple to IPD circuit elements (e.g., capacitors) in the main IPD element 145. The tunable IPD elements 148 may have a bonding pad 154. In some embodiments, the bonding pad 154 may be on an upper surface of the tunable IPD element 148 and may couple to IPD circuit elements (e.g., capacitors) in the tunable IPD element 148.

The structure of the uniform transistor-based component 110 may be configured to provide bonding (e.g., via bondwires 180) between the transistor die 120 and the second IPD circuit 140. For example, bondwires 180 may be coupled from second bonding pad 124 of the transistor die 120 to the bonding pad 144 of the main IPD element 145 of the second IPD circuit 140. As a result, the second IPD circuit 140 may be electrically connected to the transistor die 120.

The second IPD circuit 140 may provide, for example, impedance matching and/or harmonic termination to the transistor die 120. The configuration of the impedance matching and/or harmonic termination may be adjusted by varying the type and or configuration of the bondwires 180. In some embodiments, the impedance matching and/or harmonic termination may be further adjusted by electrically coupling the tunable IPD element 148 of the second IPD circuit 140 to the main IPD element 145. For example, bondwires 180 may be coupled between the bonding pad 144 of the main IPD element 145 of the second IPD circuit 140 and one or more of the bonding pads 154 of the tunable IPD element 148 of the second IPD circuit 140.

In some embodiments, the first IPD circuit 130 may provide an input impedance match and/or harmonic termination and the second IPD circuit 140 may provide an output impedance match and/or harmonic termination. Thus, by adjusting the bondwire configuration of the first IPD circuit and/or the second IPD circuit 140, an input and/or output characteristic of the uniform transistor-based component 110 may be tuned. It will be understood that bondwires 180 may be provided in any of the variations described herein, as well as in variations understood by those of ordinary skill in the art. In some embodiments, the first IPD circuit 130 may have a similar configuration as the second IPD circuit 140, but the present disclosure is not limited thereto. In some embodiments, the first IPD circuit 130 may be different and/or include different components than the second IPD circuit 140. Similarly, in some embodiments, the bondwire configuration of the first IPD circuit 130 may be the same as the bondwire configuration of the second IPD circuit 140, or may be different.

Figure 6:
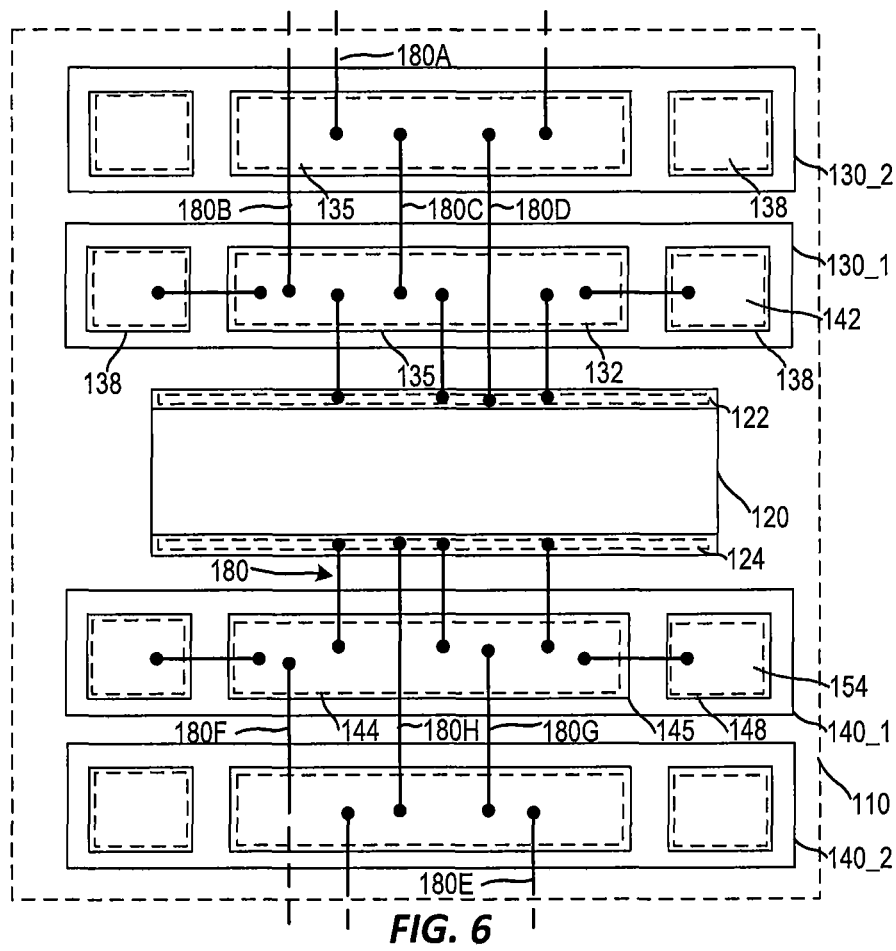
FIG. 6 illustrates an example embodiment of a uniform transistor-based component that includes a plurality of first IPD circuits and a plurality of second IPD circuits, according to some embodiments of the present disclosure.

FIG. 5 illustrates an example embodiment in which the uniform transistor-based component 110 includes a single first IPD circuit 130 and a single second IPD circuit 140, but the present disclosure is not limited thereto. In some embodiments, the uniform transistor-based component 110 may include a plurality of first IPD circuits 130 and/or a plurality of second IPD circuits 140. FIG. 6 illustrates such a configuration. Referring to FIG. 6, the uniform transistor-based component 110 may include a plurality (e.g., two) first (input) IPD circuits 130 and a plurality (e.g., two) second (output) IPD circuits 140. A description of the same or similar elements (e.g., elements having a same reference number) of FIG. 6 that have been previously discussed will be omitted for brevity.

Referring to FIG. 6, the uniform transistor-based component 110 may include a plurality of first IPD circuits 130_1, 130_2. The plurality of first IPD circuits 130_1, 130_2 may be coupled between an input lead of the device package and the transistor die 120. In addition, the uniform transistor-based component 110 may include a plurality of second IPD circuits 140_1, 140_2. The plurality of second IPD circuits 140_1, 140_2 may be coupled between the transistor die 120 and an output lead of the device package.

Though two first IPD circuits 130_1, 130_2 and two second IPD circuits 140_1, 140_2 are shown in FIG. 6, it will be understood that the present disclosure is not limited to such a configuration. In some embodiments, more than two first IPD circuits 130 and/or more than two second IPD circuits 140_1, 140_2 may be present. The presence of multiple first IPD circuits 130_1, 130_2 and/or multiple second IPD circuits 140_1, 140_2 may allow for additional variations in the possible configurations of the bondwires 180 in the uniform transistor-based component 110.

For example, in some embodiments, a bondwire 180A may be coupled from external to the uniform transistor-based component 110 (e.g., from an input lead) to a first IPD circuit 130_2 that is adjacent an edge of the uniform transistor-based component 110. In some embodiments, a bondwire 180B may extend over one or more of the first IPD circuits 130_2 to connect to another one of the first IPD circuits 130_1. In addition, in some embodiments, a bondwire 180C may be coupled from between two adjacent ones of the first IPD circuits 130_1, 130_2. In some embodiments, a bondwire 180D may extend from one of the first IPD circuits 130_2 to connect to the transistor die 120 (e.g., over one or more of the first IPD circuits 130_1) or to connect to another one of the first IPD circuits 130.

In addition, in some embodiments, a bondwire 180E may be coupled from external to the uniform transistor-based component 110 (e.g., from an output lead) to a second IPD circuit 140_2 that is adjacent an edge of the uniform transistor-based component 110. In some embodiments, a bondwire 180F may extend over one or more of the second IPD circuits 140_2 to connect to another one of the second IPD circuits 140_1. In addition, in some embodiments, a bondwire 180G may be coupled between two adjacent ones of the second IPD circuits 140_1, 140_2. In some embodiments, a bondwire 180G may extend from one of the second IPD circuits 1402 to connect to the transistor die 120 (e.g., over one or more of the second IPD circuits 140_1) or to connect to another one of the second IPD circuits 140.

Each of the first IPD circuits 130_1, 130_2 may include a main IPD element 135 and one or more tunable IPD elements 138. Similarly, each of the second IPD circuits 140_1, 140_2 may include a main IPD element 145 and one or more tunable IPD elements 148. Bondwires 180 may be coupled between the main IPD elements 135, 145 and the tunable IPD elements 138, 148 to adjust a characteristic (e.g., an impedance) of the first and second IPD circuits 130_1, 130_2, 140_1, 140_2. The configuration of the tunable IPD elements 138 of the first IPD circuits 130_1, 130_2 (e.g., the number and configuration of the connecting bondwires 180) need not be the same. Similarly, the configuration of the tunable IPD elements 148 of the second IPD circuits 140_1, 140_2 (e.g., the number and configuration of the connecting bondwires 180) need not be the same.

Figure 7:
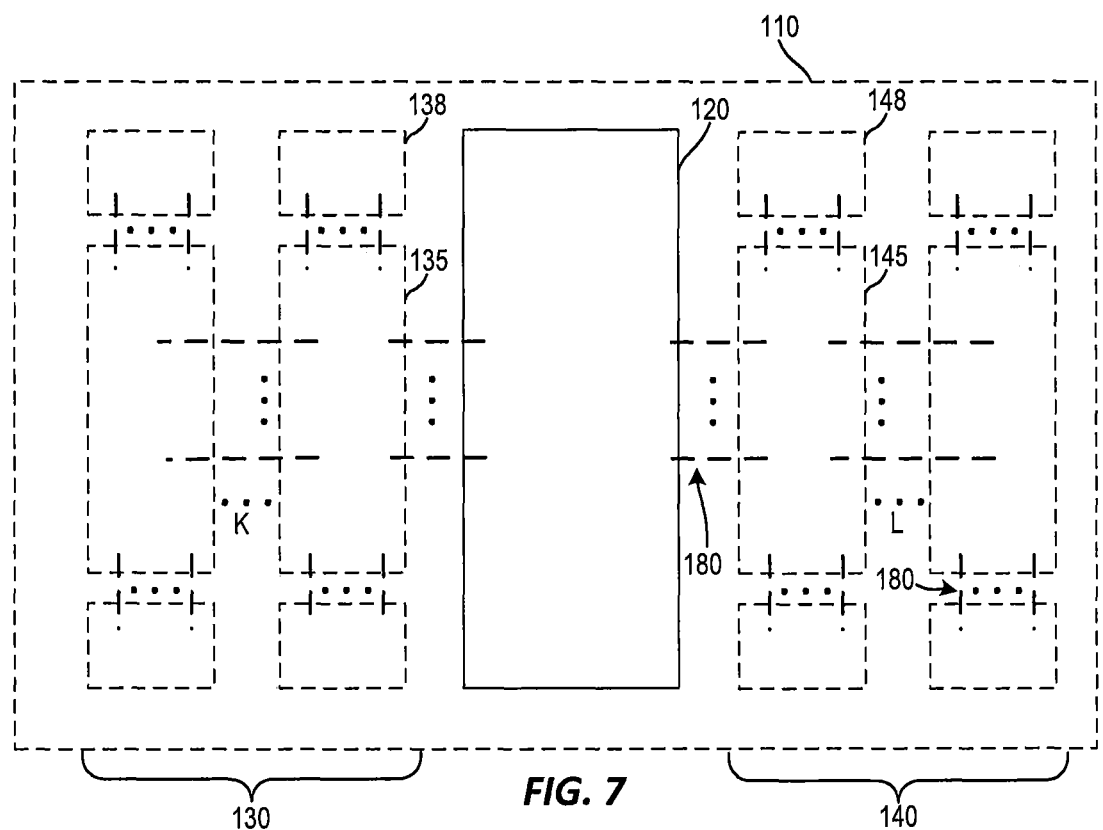
FIG. 7 is a schematic representation of a uniform transistor-based component, according to some embodiments of the present disclosure.

FIG. 7 is a schematic representation of a uniform transistor-based component 110, according to some embodiments of the present disclosure. FIG. 7 is intended to illustrate a generic example of some embodiments of the present disclosure. The embodiment illustrated in FIG. 7 will be used in further figures provided herein to assist in describing the use of the uniform transistor-based component 110 in a plurality of packages.

For example, FIG. 7 illustrates a uniform transistor-based component 110. As described herein, the uniform transistor-based component 110 may include one or more first IPD circuit 130 and/or one or more second IPD circuits 140. The number of devices illustrated in FIG. 7 is for example purposes only and is not intended to limit the present disclosure. In some embodiments, the uniform transistor-based component 110 may include a plurality of transistor dies 120. For example, though FIG. 7 only illustrates two first IPD circuits 130, the uniform transistor-based component 110 may include K first IPD circuits 130. Similarly, though FIG. 7 only illustrates two second IPD circuits 140, the uniform transistor-based component 110 may include L second IPD circuits 140. In FIG. 7, the one or more first IPD circuits 130 and the one or more second IPD circuits 140 are illustrated with dotted lines to indicate that they are optional. For example, in some embodiments, the uniform transistor-based component 110 may include no first IPD circuits 130, one first IPD circuit 130, or a plurality of first IPD circuits 130. In some embodiments, the uniform transistor-based component 110 may include no second IPD circuits 140, one second IPD circuit 140, or a plurality of second IPD circuits 140.

The first IPD circuit 130 and the second IPD circuit 140 may be configured similarly to the first and second IPD circuits 130, 140 described herein with respect to FIGS. 2 to 6. In other words, the first IPD circuit 130 may include a main IPD element 135 and one or more tunable IPD elements 138 and the second IPD circuit 140 may include a main IPD element 145 and one or more tunable IPD elements 148. In some embodiments, the first IPD circuit 130 may be substantially similar and/or identical to the second IPD circuit 140, though the present disclosure is not limited thereto.

The first IPD circuit 130 and the second IPD circuit 140 may be configured to be selectively coupled to the transistor die 120 by one or more bondwires 180. In addition, the tunable IPD elements 138, 148 may be configured to be selectively coupled to the main IPD elements 135, 145 of the first and second IPD circuits 130, 140. Example bondwires 180 are illustrated in dashed lines in FIG. 7 to illustrate how, in some embodiments, the elements of the uniform transistor-based component 110 may be interconnected. The bondwires 180 are illustrated using dashed lines to illustrate that both the location as well as the profile of the bondwires is selectively configurable, as described herein, and may be modified as necessary to modify the characteristics of the uniform transistor-based component 110.

Figure 8:
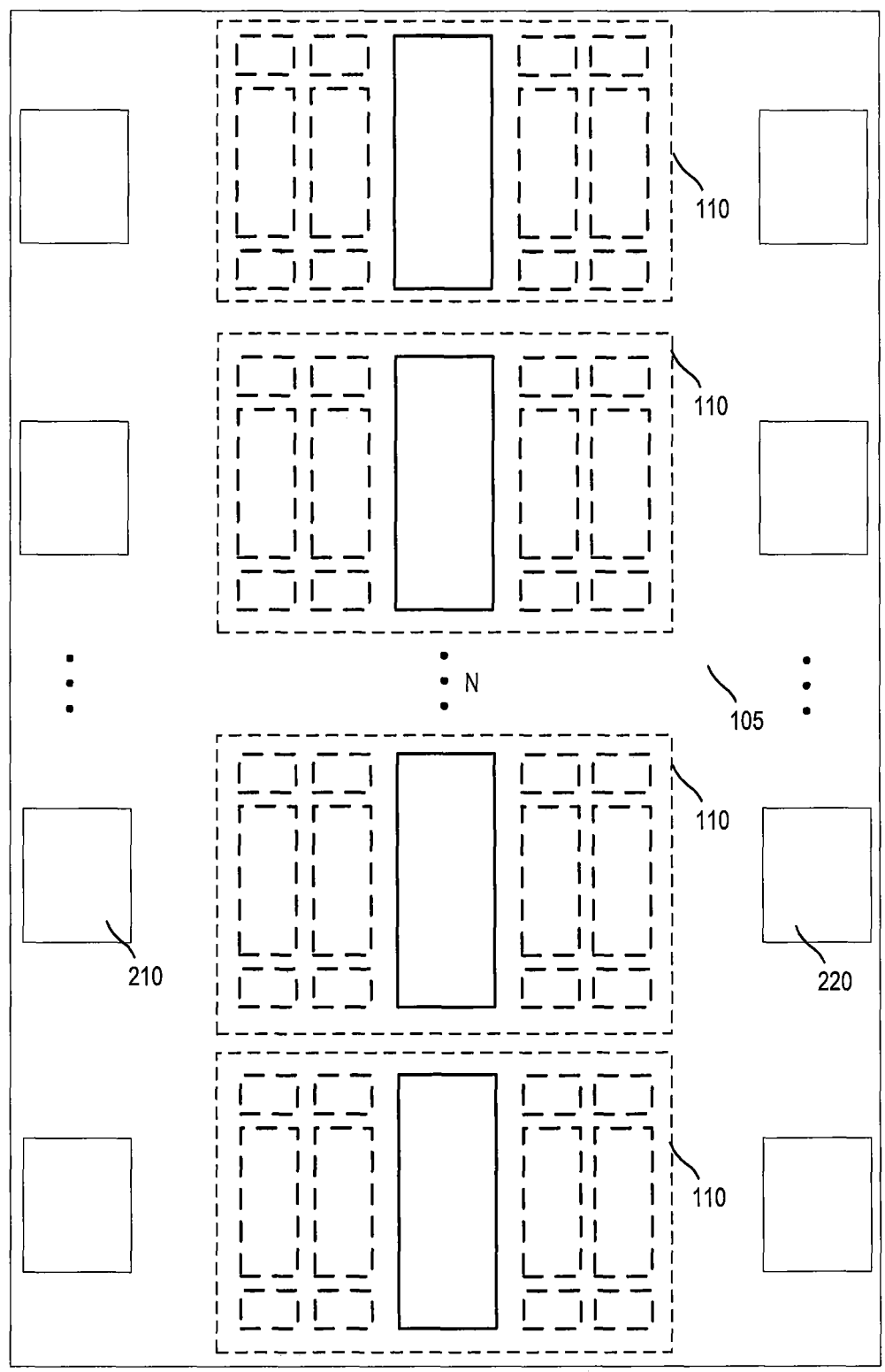
FIG. 8 illustrates an example of the use of the uniform transistor-based component in a device package, according to some embodiments of the present disclosure.

FIG. 8 illustrates an example of the use of the uniform transistor-based component 110 in a semiconductor package 100, according to some embodiments of the present disclosure. In some embodiments, the package 100 may include a plurality of input leads 210 and a plurality of output leads 220. In some embodiments, the semiconductor package 100 may be a dual-flat no-leads (DFN) package, though the embodiments of the present disclosure are not limited thereto. In some embodiments, the semiconductor package 100 may be a quad-flat no-leads (QFN) package.

A plurality of uniform transistor-based components 110 may be arranged within the package 100 to provide a configurable semiconductor device platform. For example, in some embodiments N uniform transistor-based components 110 may be arranged on a substrate and/or submount 105 of the package 100. In some embodiments, the individual components (e.g., the IPD devices and/or the transistor die) of the uniform transistor-based components 110 may be respectively bonded to the submount 105, e.g., by eutectic bonding, Ag sintering, or other known technique. In some embodiments, the individual components (e.g., the IPD devices and/or the transistor die) of the uniform transistor-based components 110 may first be attached to a carrier substrate and the carrier substrate may be bonded to the submount 105.

In FIG. 8, the package 100 is illustrated without bondwires. As described herein, the use of the uniform transistor-based components 110 may allow for the use of a single or small number of variations of the package 100 that can provide a plurality of different final packages having different physical characteristics from one another. By varying the configuration of the bondwires attached to the uniform transistor-based components 110 of the package 100, different types of different devices may be provided with less complexity than conventional processing.

In addition, by utilizing a plurality of uniform transistor-based components 110, phase relationships between different paths of the package 100 can be maintained relatively constant. In packages using different configurations of transistor dies and/or IPD circuits in different paths of the package, a phase relationship between the different paths can be altered. By using a relatively constant set of devices between each of the paths, a phase symmetry between each of the paths may be maintained. As a result, the input and output leads of the package may be maintained at a same, or substantially the same, absolute phase.

FIGS. 9A to 9G illustrate example configurations of device packages utilizing a uniform transistor-based component 110, according to some embodiments of the present disclosure. In FIGS. 9A to 9G, the uniform transistor-based component 110 is illustrated schematically using the format described above with respect to FIG. 7. However, as will be understood by one of ordinary skill in the art, the uniform transistor-based component 110 may include a plurality of IPD circuits 130, 140 and/or one or more transistor dies 120. In some embodiments, the uniform transistor-based component 110 may include first IPD circuits 130 that are all a same or similar device. In some embodiments, the uniform transistor-based component 110 may include second IPD circuits 140 that are all a same or similar device. In some embodiments, the first IPD circuits 130 and the second IPD circuits 140 of each of the uniform transistor-based components 110 may be a same or similar device. In some embodiments, the transistor dies 120 of each of the uniform transistor-based components 110 may be a same or similar device.

Figure 9A:
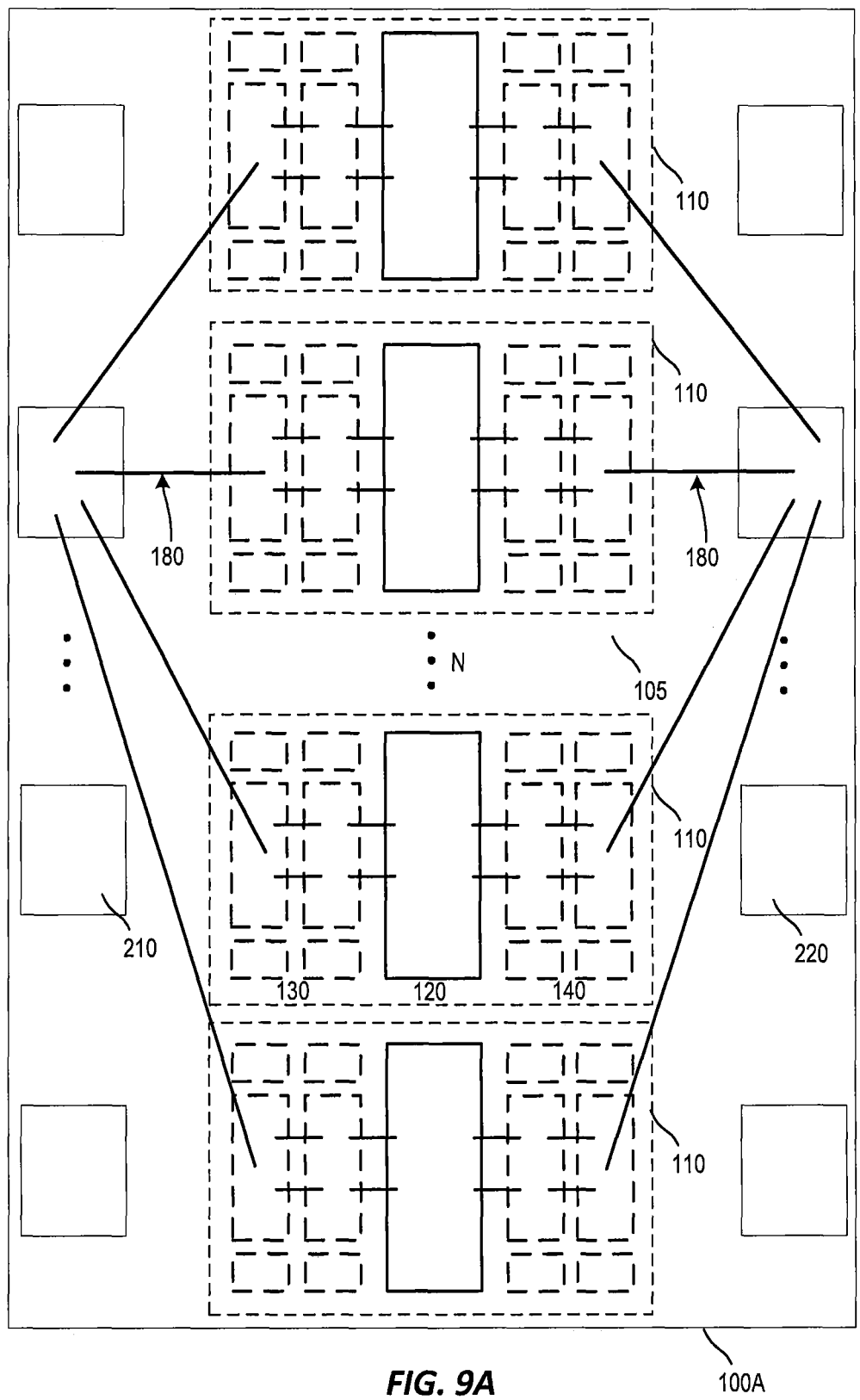
FIGS. 9A to 9G illustrate example configurations of a semiconductor package utilizing a uniform transistor-based component, according to some embodiments of the present disclosure.

Though a package may include a plurality of uniform transistor-based components 110, a number of different device configurations may be achieved by merely varying a bondwire configuration. For example, referring to FIG. 9A, a device package 100A may incorporate N uniform transistor-based components 110 that are each coupled to a single input lead 210 and a single output lead 220. For example, one or more bondwires 180 may be coupled between the input lead 210 and a first of the uniform transistor-based components 110, between the input lead 210 and a second of the uniform transistor-based components 110, and between the input lead 210 and an Nth of the uniform transistor-based components 110. Though only one bondwire 180 is illustrated in FIG. 9A connecting the input lead 210 and respective ones of the uniform transistor-based components 110, it will be understood that a plurality of bondwires 180 may be used. One or more bondwires 180 may be coupled between the output lead 220 and various ones of the uniform transistor-based components 110 in a manner similar as between the input lead 210 and the uniform transistor-based components 110. In some embodiments, there may be more uniform transistor-based components 110 in the package 100A than are used in the package 100A. That is to say that some uniform transistor-based components 110 may be present in the package 100A, but may not be interconnected in the package 100A with bondwires 180.

Within respective ones of the uniform transistor-based components 110, connections may be made between the circuits of the uniform transistor-based component 110 using bondwires 180. For example, as discussed herein, connections may be made between individual ones of the IPD circuits 130, 140, and between the IPD circuits 130, 140 and the transistor die 120, using bondwires 180. In some embodiments, bondwires 180 may be used to make connections between the main elements and the tunable elements of the IPD circuits, as discussed herein with respect to FIGS. 3A to 6. Thus, the connections between the input lead 210 and the respective uniform transistor-based components 110 may generate a particular type of amplifier package, while the arrangement of the bondwires 180 between and within the uniform transistor-based components 110 may allow for a number of variations of the device package 100A.

Figure 9B:
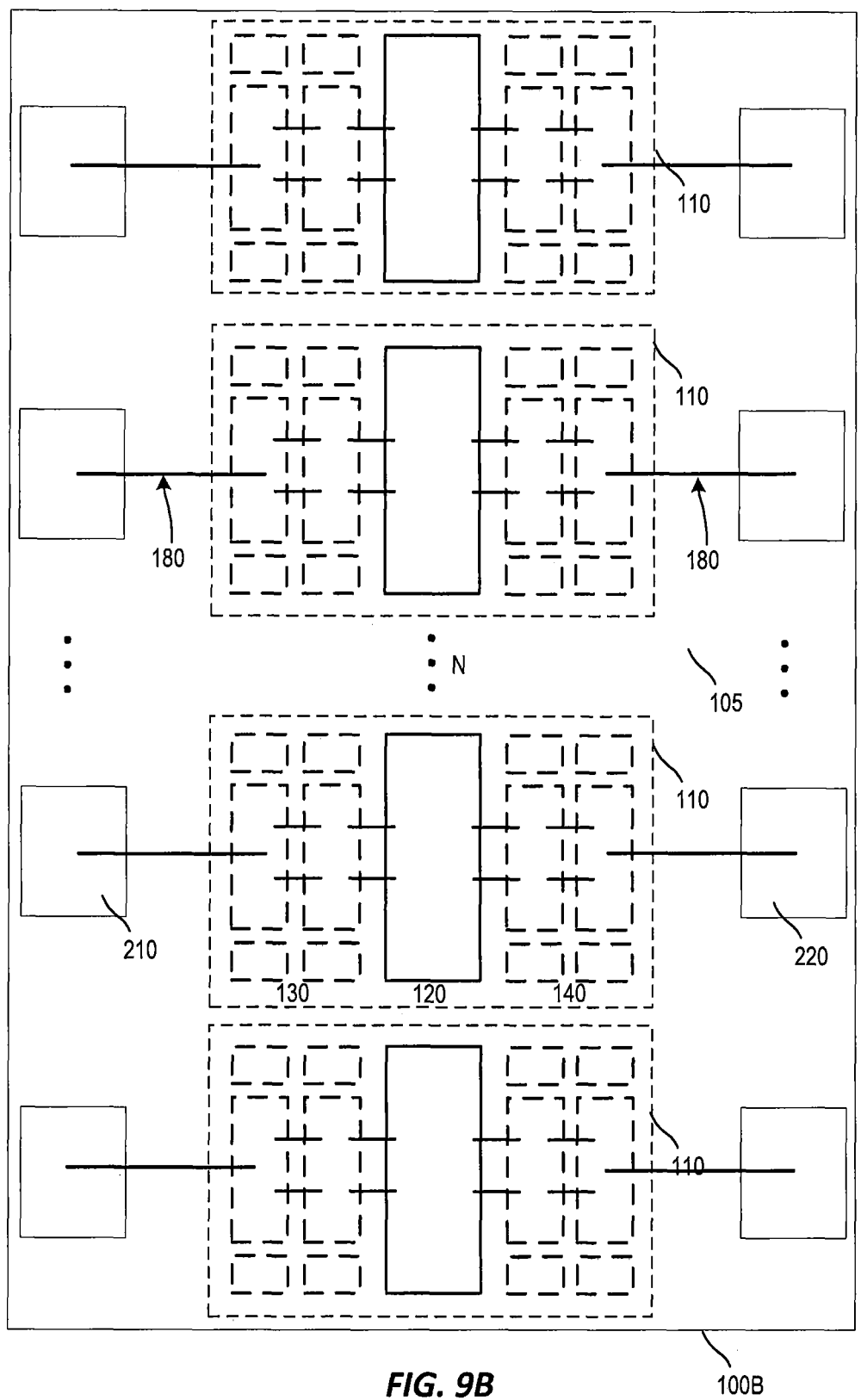

FIG. 9B illustrates a 1:1 configuration of a device package 100B, according to some embodiments of the present disclosure. Details of FIG. 9B that are the same or similar as those previously described will be omitted for brevity. Referring to FIG. 9B, the device package 100B may incorporate N uniform transistor-based components 110, each respectively coupled to a single input lead 210 and a single output lead 220. For example, a first bondwire 180 may be coupled between a first input lead 210 and a first subset of one of the uniform transistor-based components 110, a second bondwire 180 may be coupled between a second input lead 210 and a second subset of one of the uniform transistor-based components 110, and an Nth bondwire 180 may be coupled between an Nth input lead 210 and an Nth subset of one of the uniform transistor-based components 110. Though only one bondwire 180 is illustrated in FIG. 9B connecting each input lead 210 and respective ones of the uniform transistor-based components 110, it will be understood that a plurality of bondwires 180 may be used. One or more bondwires 180 may be respectively coupled between each output lead 220 and each uniform transistor-based component 110 in a manner similar as between the input leads 210 and the uniform transistor-based components 110. As previously described, connections may be made between the circuits of the uniform transistor-based component 110 using bondwires 180. The configuration illustrated in FIG. 9B may result in N separate amplifier paths, each with its own input and output lead.

Figure 9C:
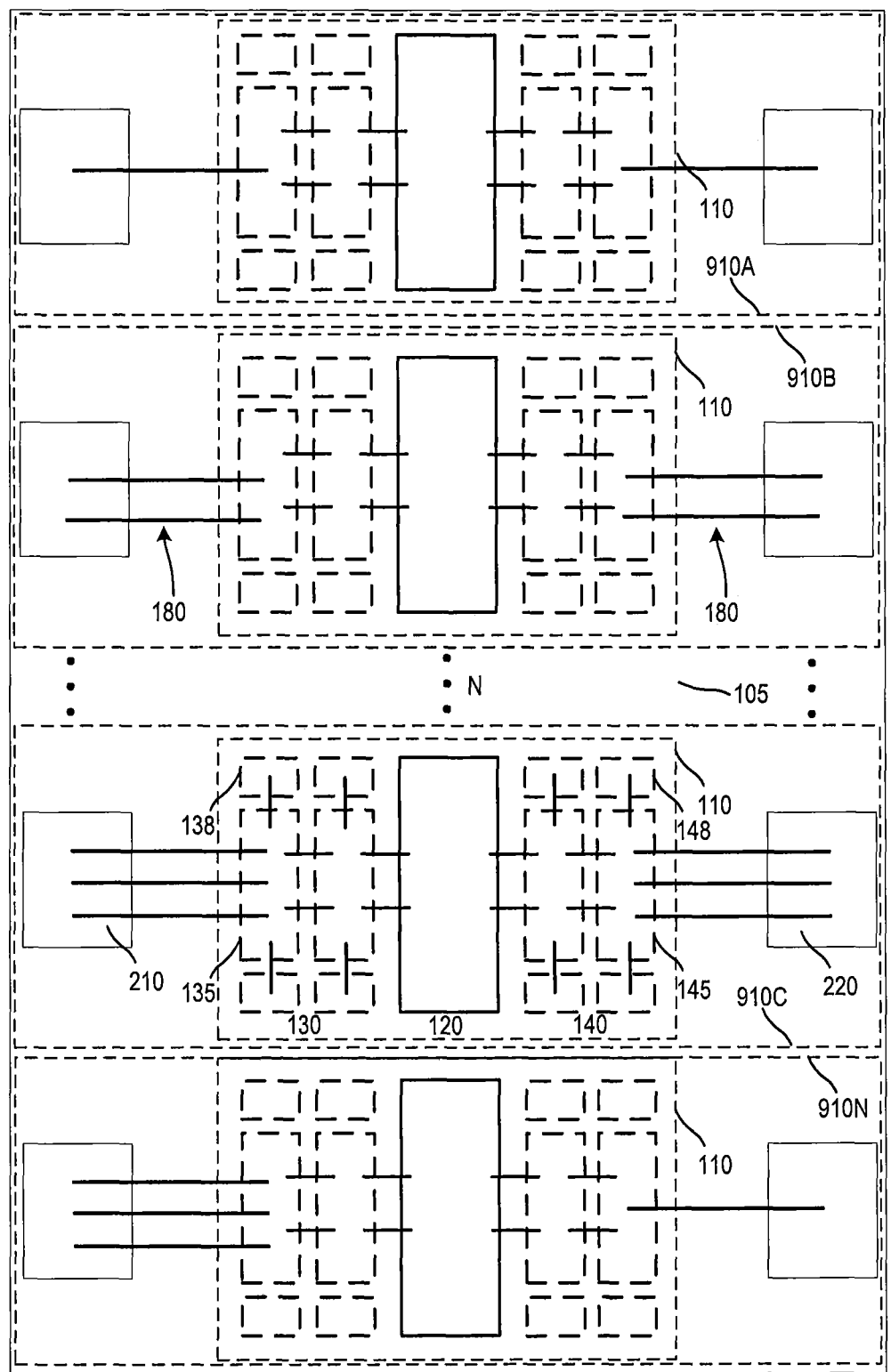

In FIG. 9B, each of the paths of the device package 100B is illustrated having a same number of bondwires 180 connecting the input lead 210 to the uniform transistor-based component 110 and connecting the uniform transistor-based component 110 to the output lead 220. However, the present disclosure is not limited to such a configuration. FIG. 9C illustrates a device package 100C in which the number of bondwires 180 are varied between the different paths. For example, referring to FIG. 9C, a first amplifier path 910A may incorporate a first number and/or configuration of bondwires 180 between the input lead 210 and the uniform transistor-based component 110 and/or between the uniform transistor-based component 110 and the output lead 220. These are illustrated as a single bondwire, but it will be understood that this is only an example and other configurations and/or profiles may be used without deviating from the present disclosure.

As illustrated in FIG. 9C, a second amplifier path 910B may have a different configuration and/or number of bondwires 180 than the first amplifier path 910A. A third amplifier path 910C may have a different configuration and/or number of bondwires 180 than the first and second amplifier paths 910A, 910B.

FIG. 9C also illustrates that the third amplifier path 910C also has a different configuration of bondwires 180 within the uniform transistor-based component 110 than in the uniform transistor-based components 110 of the first and second amplifier paths 910A, 910B. For example, the third amplifier path 910C is illustrated as having bondwires 180 between the main IPD elements 135, 145 and the tunable IPD elements 138, 148 of the IPD circuits 130, 140. Thus, the embodiments of the present disclosure support configurations in which connections within and/or internal to a uniform transistor-based component 110 are varied within the uniform transistor-based components 110 of a particular package.

An Nth amplifier path 910N in FIG. 9C illustrates that the input side and output side may including bondwires 180 having different configurations from one another. For example, a number and/or configuration of bondwires 180 between the input lead 210 and the uniform transistor-based component 110 may be different than a number and/or configuration of bondwires 180 between the uniform transistor-based component 110 and the output lead 220.

Figure 9D:
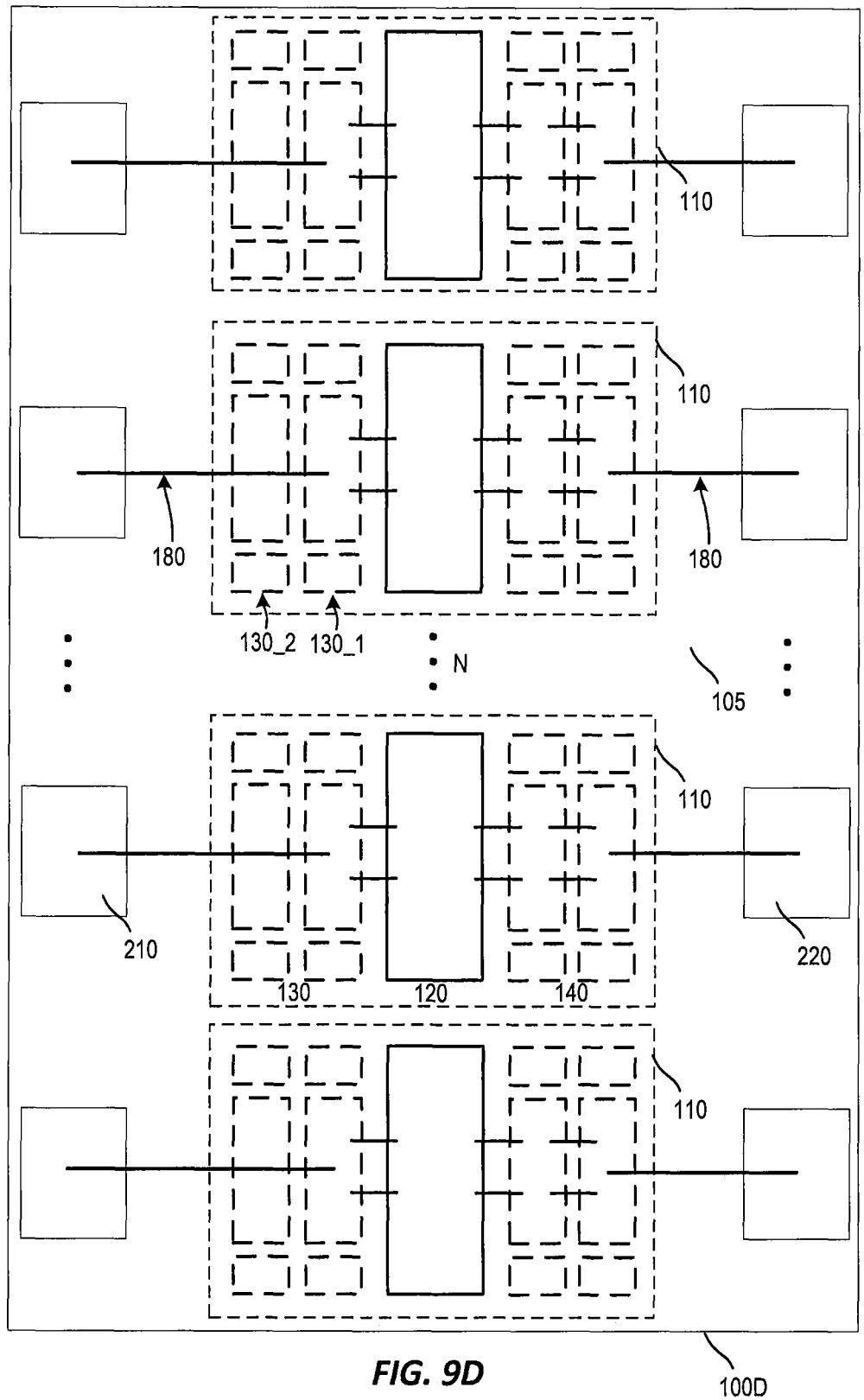

In FIGS. 9A to 9C, bondwires 180 have been illustrated between each of the various IPD circuits 130, 140 of the uniform transistor-based components 110. However, the present disclosure is not limited to such a configuration. As illustrated in FIG. 9D, a package 100D may not connect to all of the devices of the uniform transistor-based component 110. For example, the uniform transistor-based component 110 may include a plurality of first IPD circuits 130_1, 130_2 arranged as illustrated in FIG. 7. In some embodiments, one or more bondwires 180 may be coupled between an input lead 210 and one of the first IPD circuits 130_1, but not to another of the first IPD circuits 130_2. That is to say that a first IPD circuit 130_2 may be present within the package 100D, but not have bondwires 180 connected thereto. While this may seem counterintuitive, the benefits that may be obtained in terms of package flexibility and reduction in processing costs may make it economically beneficial to include a device in the uniform transistor-based component 110 that is not ultimately used in the package 100D. Thus, the device may remain present but substantially dormant (e.g., with no signal being intentionally passed through the device) during the operation of the package 100D.

Figure 9E:
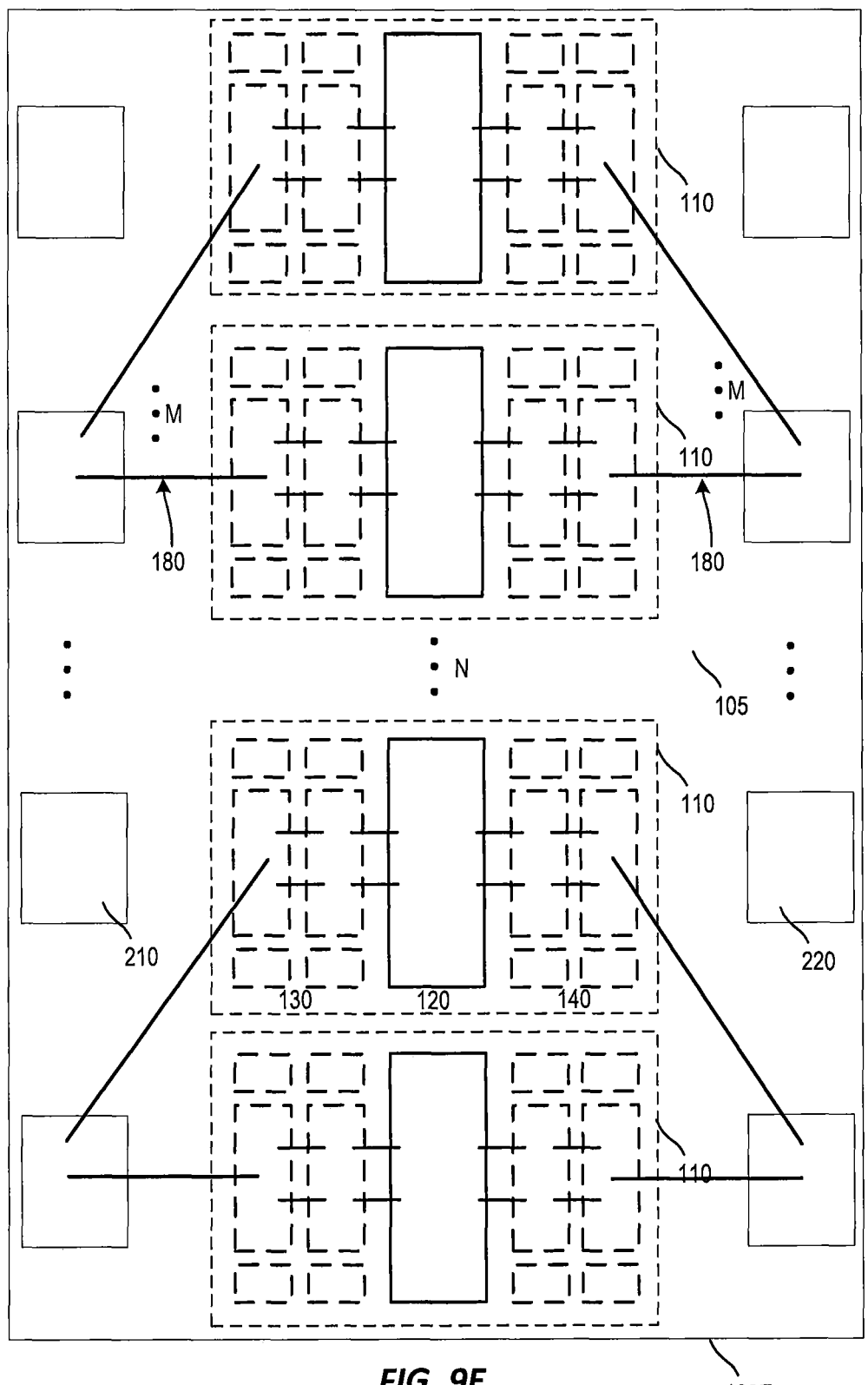

Though FIGS. 9A to 9D illustrate a 1:1 configuration, the present disclosure is not limited thereto. FIG. 9E illustrates an M:M configuration, according to some embodiments of the present disclosure. Referring to FIG. 9E, a device package 100E may incorporate M uniform transistor-based components 110 coupled to a single input lead 210 and a single output lead 220. For example, one or more bondwires 180 may be coupled between a first input lead 210 and a subset of M of the uniform transistor-based components 110 and between another input lead 210 and a subset of M uniform transistor-based components 110. In FIG. 9E, the M devices are illustrated as two devices (e.g., a 2:2 configuration), but the present disclosure is not limited thereto. Though only one bondwire 180 is illustrated in FIG. 9E connecting the input lead 210 and respective ones of the M uniform transistor-based components 110, it will be understood that a plurality of bondwires 180 may be used. One or more bondwires 180 may be coupled between an output lead 220 and M of the uniform transistor-based components 110 in a manner similar as between the input lead 210 and the M uniform transistor-based components 110. As previously described, connections may be made between the circuits of the uniform transistor-based component 110 using bondwires 180. The configuration illustrated in FIG. 9B may result in a plurality of separate amplifier paths, each with its own input and output lead.

In addition to the symmetric configurations of FIGS. 9A to 9E, embodiments of the present disclosure also support the use of the uniform transistor-based components 110 in asymmetric configurations. In related art, the use of asymmetric configurations in a transistor package is often accomplished through the use of different transistor die having different sizes on different paths in the amplifier package. As used herein with respect to the uniform transistor-based components 110, asymmetry and/or an asymmetric configuration refers to amplifier packages having paths which are provided different power levels at each input (e.g., at input lead 210), have different total gate peripheries (as a sum of all of the gate peripheries of the transistor dies 120 on a given path (e.g., coupled to an input lead 210), and/or have configurations in which the transistor dies 120 of a first path are provided a different input power than transistor dies 120 of a second path. By combining multiple uniform transistor-based components 110 on a single path (e.g., by connecting the transistor dies 120 in parallel), embodiments according to the present disclosure may achieve asymmetry by using combinations of common transistor-based components 110 that would conventionally be achieved by using different types of transistor dies. Embodiments of the present disclosure may provide comparable asymmetric performance with less manufacturing complexity and easier modification.

Figure 9F:
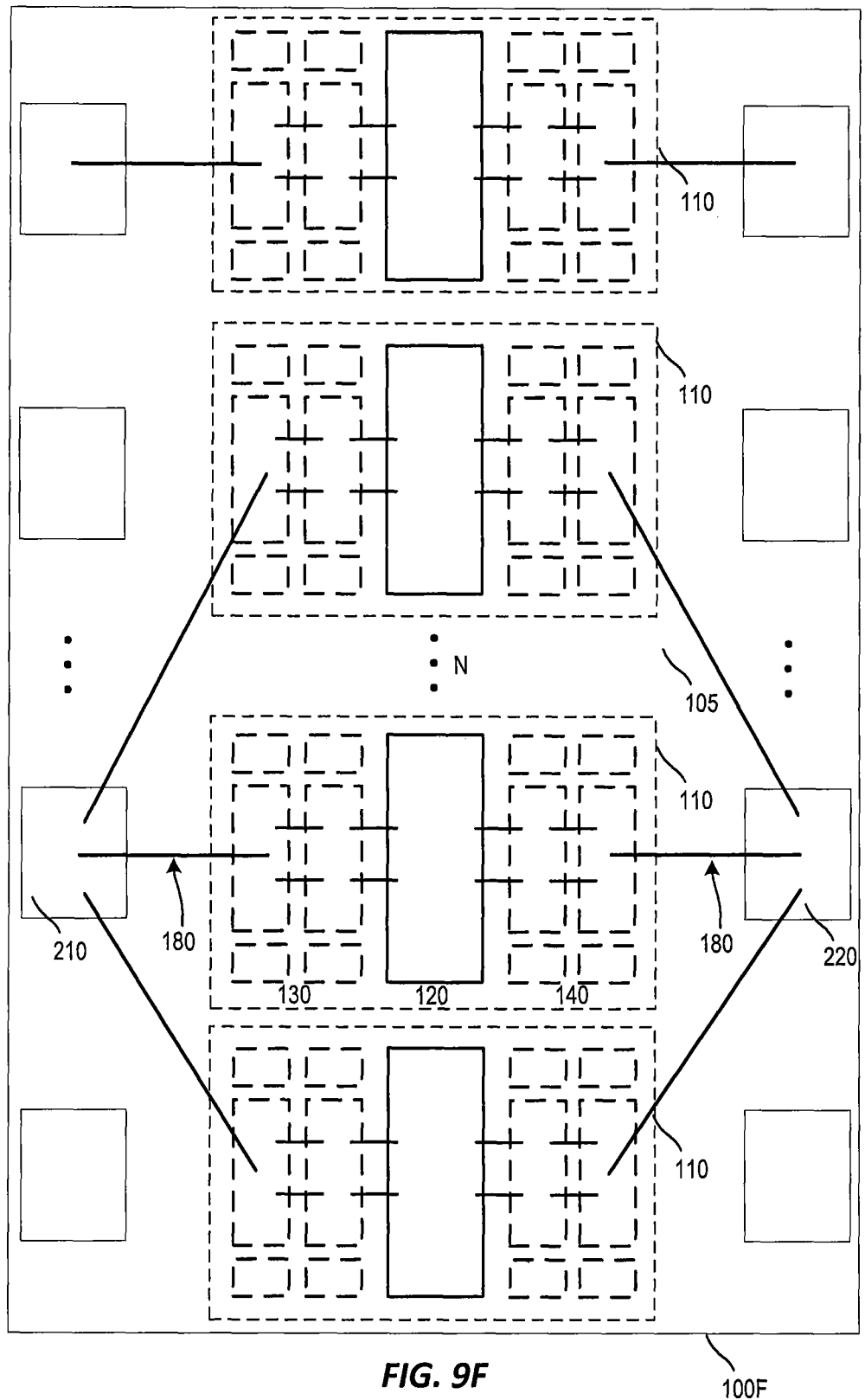

FIG. 9F illustrates a device package 100F having an S:T asymmetric configuration, according to some embodiments of the present disclosure. Referring to FIG. 9F, a device package 100F may incorporate a subset of S uniform transistor-based components 110 coupled to a first input lead 210 and a first output lead 220 as well as a subset of T uniform transistor-based components 110 coupled to a second input lead 210 and a second output lead 220, where S and T are different natural numbers. For example, one or more bondwires 180 may be coupled between a first input lead 210 and S of the uniform transistor-based components 110 and between a second input lead 210 and T uniform transistor-based components 110. In FIG. 9F, the S devices are illustrated as one device and the T devices are illustrated as three devices (e.g., a 1:3 configuration), but the present disclosure is not limited thereto. Though only one bondwire 180 is illustrated in FIG. 9F connecting the first input lead 210 to respective ones of the S uniform transistor-based components 110 and connecting the second input lead 210 to respective ones of the T uniform transistor-based components 110, it will be understood that a plurality of bondwires 180 may be used. One or more bondwires 180 may be coupled between a first output lead 220 and the S uniform transistor-based components 110 and between a second output lead 220 and the T uniform transistor-based components 110 in a manner similar as between the input leads 210 and the S and T uniform transistor-based components 110. As previously described, connections may be made between the circuits of the uniform transistor-based component 110 using bondwires 180. The configuration illustrated in FIG. 9F may result in a device package 100F having multiple amplifier paths that are asymmetric (e.g., paths having different amplifier gains), each with its own input and output lead. For example, the multiple paths of the device package 100F may be main and peaking amplifiers of a Doherty amplifier or other asymmetric configuration.

Referring to FIG. 9F, it can be seen that if each of the uniform transistor-based components 110 include a same type/size of transistor die 120, a total gate periphery of the transistor dies 120 on a first path (e.g., the path with one uniform transistor-based component 110) is different than a total gate periphery of the transistor dies 120 on a second path (e.g., the path with three uniform transistor-based components 110). This may result in the ability to provide a higher gain and/or power handling capability on the second path. Also, given the bondwires 180 coupling the different numbers of uniform transistor-based components 110 in the two paths illustrated in FIG. 9F, if a same power is applied to each of the input leads 210, different power levels will be delivered to the uniform transistor-based components 110 of the two paths. In some embodiments, a same power may be delivered to the uniform transistor-based components 110 of the two paths if different power levels are applied to the input leads 210. Therefore, by coupling different subsets of pluralities of the uniform transistor-based components 110 to the input leads, uniform transistor-based components 110 may be used to provide an asymmetric transistor package.

Figure 9G:
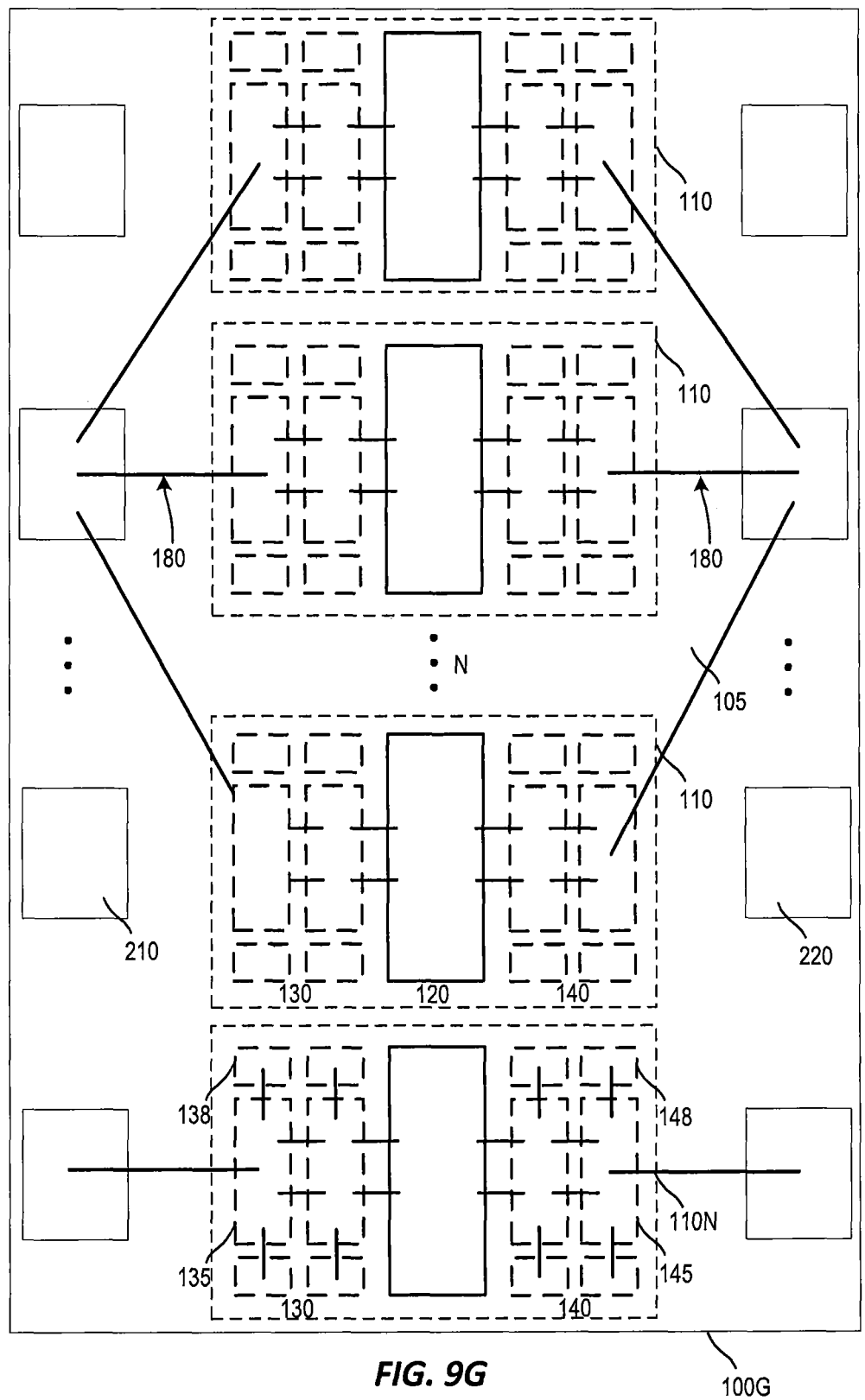

FIG. 9G illustrates a device package 100G somewhat similar to that of 9F, but illustrates that the configuration of the various uniform transistor-based components 110 may be rearranged simply by changing the positioning of the bondwires 180. For example, the device package 100G includes a T:S configuration similar to that of FIG. 9F with the input leads 210 (and output leads 220) reversed. FIG. 9G also illustrates that one of the uniform transistor-based components 110N (the bottom uniform transistor-based component 110N in FIG. 9G) has a different configuration of bondwires 180 within the uniform transistor-based component 110N than in the uniform transistor-based components 110 of the other amplifier paths. For example, the uniform transistor-based component 110N is illustrated as having bondwires 180 between the main IPD elements 135, 145 and the tunable IPD elements 138, 148 of the IPD circuits 130, 140. Thus, the embodiments of the present disclosure support configurations in which connections within a uniform transistor-based component 110 are varied within the uniform transistor-based components 110 and/or paths of a particular package.

In FIGS. 9A to 9G, the various device packages 100A-100G are illustrating having bondwires 180 configured directly between the input leads 210 and the uniform transistor-based components 110 and/or between the output leads 220 and the uniform transistor-based components 110. However, these configurations are presented to simplify the discussion and are not intended to limit the embodiments of the disclosure. For example, in some embodiments additional circuit elements such as combiners, splitters, biasing circuitry, other control circuitry and the like may be coupled between the input and output leads 210, 220 and the uniform transistor-based components 110.

Figure 10:
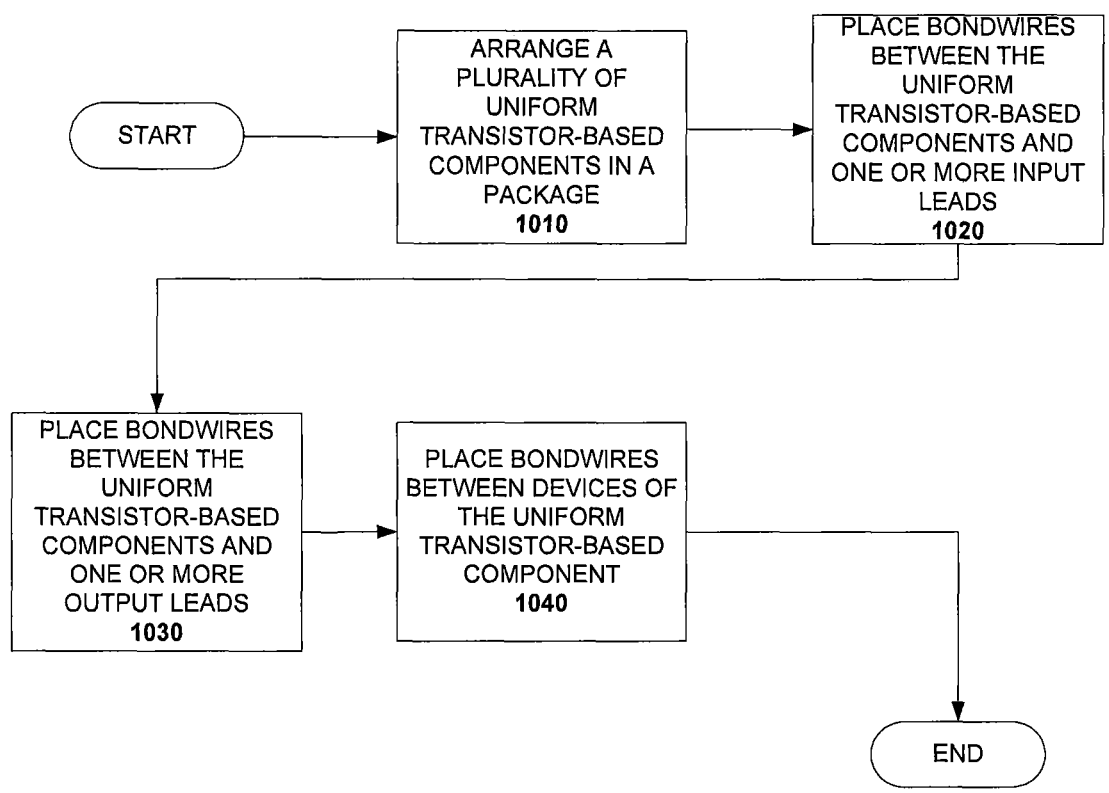
FIG. 10 illustrates a process for fabricating a device package, according to some embodiments of the present disclosure.

FIG. 10 illustrates a process for fabricating a device package, according to some embodiments of the present disclosure. Referring to FIG. 10, the process may include arranging 1010 a plurality of uniform transistor-based components within a package. For example, the uniform transistor-based components may be similar to the uniform transistor-based components 110 illustrated in the figures and described herein. The package may include, for example, an open cavity package and/or an overmold package such as those described herein. In some embodiments, the package may include a DFN or a QFN package. Placing the uniform transistor-based components within the package may include placing and/or bonding individual components (e.g., IPD circuits and/or transistor dies) on a submount of the package. In some embodiments, the devices of the uniform transistor-based component may be first bonded to a carrier substrate, and the carrier substrate may be placed and/or bonded to the submount of the package.

The process may include placing 1020 bondwires between one or more of the uniform transistor-based components and one or more input leads of the package. For example, one end of the bondwire may be bonded to the input lead and another end may be bonded to one or more bonding pads of an IPD device and/or transistor die of the uniform transistor-based component. In some embodiments, different input leads of the package may be coupled to different combinations of uniform transistor-based components of the package.

The process may include placing 1030 bondwires between one or more of the uniform transistor-based components and one or more output leads of the package. For example, one end of the bondwire may be bonded to the output lead and another end may be bonded to one or more bonding pads of an IPD device and/or transistor die of the uniform transistor-based component. In some embodiments, different output leads of the package may be coupled to different combinations of uniform transistor-based components of the package.

The process may include placing 1040 bondwires between devices of respective ones of the uniform transistor-based components. For example, one end of the bondwire may be bonded to a bonding pad of one of the IPD devices of the uniform transistor-based component and another end may be bonded to another one of the IPD devices or a transistor die of the uniform transistor-based component. In some embodiments, bondwires may be provided between tunable elements of the IPD devices and main elements of the IPD devices, as described herein, to adjust a configuration of the uniform transistor-based component.

Figure 11:
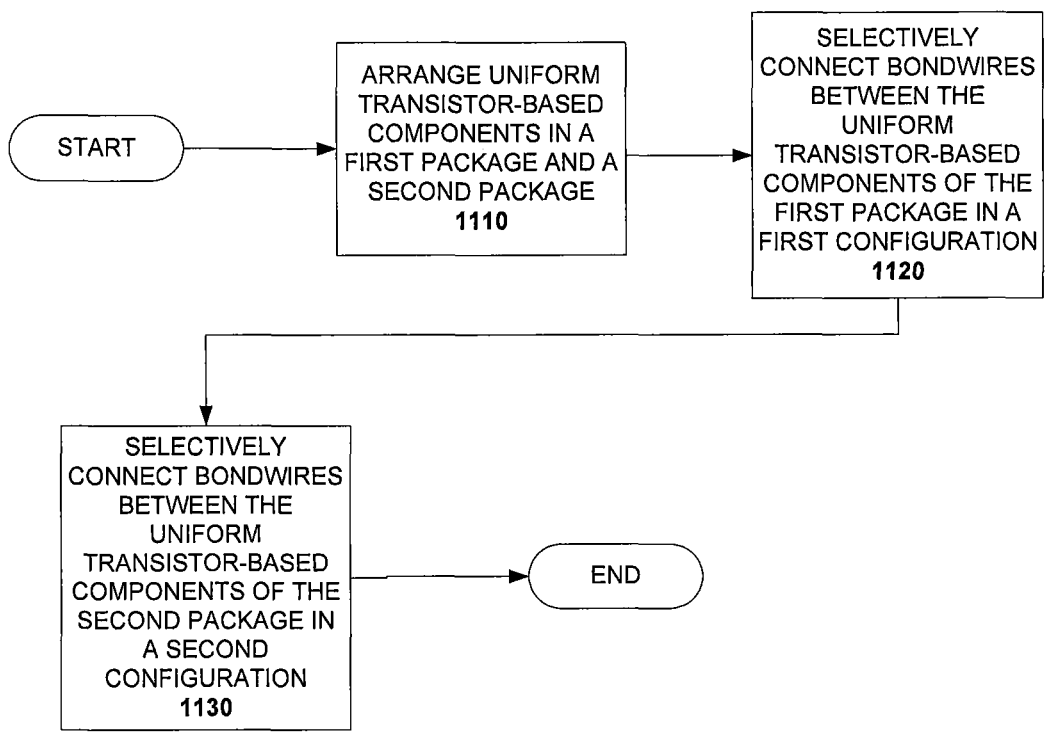
FIG. 11 illustrates a process for fabricating multiple device packages utilizing a uniform transistor-based component, according to some embodiments of the present disclosure.

FIG. 11 illustrates a process for fabricating multiple device packages utilizing a uniform transistor-based component, according to some embodiments of the present disclosure. Referring to FIG. 11, the process may include arranging 1110 a plurality of uniform transistor-based components within a first package and a second package. For example, the uniform transistor-based components may be similar to the uniform transistor-based components 110 illustrated in the figures and described herein. The first and second packages may include, for example, an open cavity package and/or an overmold package such as those described herein. In some embodiments, the first and second packages may include a DFN or a QFN package. In some embodiments, the first package may be different than the second package. Placing the uniform transistor-based components within the first and second packages may include placing and/or bonding individual components (e.g., IPD circuits and/or transistor dies) of the uniform transistor-based components on a submount of the first and second packages. In some embodiments, the devices of the uniform transistor-based component may be first bonded to a carrier substrate, and the carrier substrate may be placed and/or bonded to the submount of the first and/or the second package. In some embodiments, a layout (e.g., a spatial arrangement on the submount/substrate) of the plurality of uniform transistor-based components within the first package may be identical to a layout of the plurality of uniform transistor-based components within the second package.

The process may include selectively connecting 1120 bondwires between one or more of the uniform transistor-based components of the first package in a first configuration. For example, bondwires may be bonded to one or more of the input leads of the first package and one or more of the uniform transistor-based components placed within the first package. In addition, bondwires may be placed between one or more of the uniform transistor-based components and one or more output leads of the first package. Also, bondwires may be placed between devices of respective ones of the uniform transistor-based components. The placement of the various bondwires within the first package may be referred to as a first configuration.

The process may include selectively connecting 1130 bondwires between one or more of the uniform transistor-based components of the second package in a second configuration. As with the first package, the bondwires may be placed between one or more input leads of the second package and one or more of the uniform transistor-based components, between one or more output leads of the second package and one or more of the uniform transistor-based components, and between various devices of respective ones of the uniform transistor-based components. The bondwires of the second package may be arranged in a second configuration that is different than the first configuration of the first package. For example, the first package may be configured as a symmetric package (e.g., an M:M transistor package) while the second package may be configured as an asymmetric package (e.g., an S:T transistor package). In this way, a second package that performs differently than the first package may be provided while varying only and/or primarily the bondwire configurations in and between the uniform transistor-based components of the respective packages.

Figure 12:
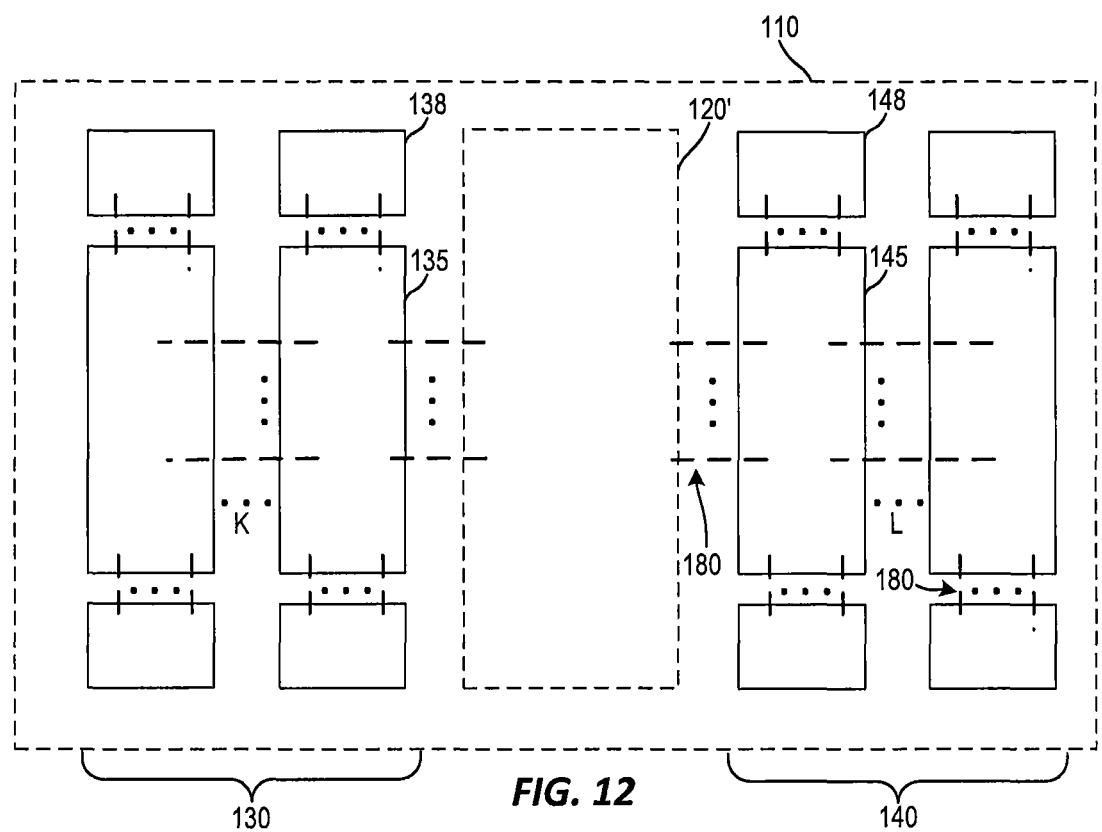
FIG. 12 is a schematic representation of a uniform transistor-based component incorporating uniform IPD devices, according to some embodiments of the present disclosure.

As discussed herein, some embodiments of a uniform transistor-based component may include uniform IPD devices and/or uniform transistor dies. FIG. 12 is a schematic representation of a uniform transistor-based component 110 incorporating uniform IPD circuits 130, 140, according to some embodiments of the present disclosure. FIG. 12 illustrates an embodiment of the uniform transistor-based component 110 in which one or more of the IPD circuits 130, 140 may be uniform, while a transistor die 120' is allowed to vary.

For example, FIG. 12 illustrates a uniform transistor-based component 110. As described herein, the uniform transistor-based component 110 may include one or more first IPD circuit 130 and/or one or more second IPD circuits 140. The number of devices illustrated in FIG. 12 is for example purposes only and is not intended to limit the present disclosure. In some embodiments, the uniform transistor-based component 110 may include a plurality of transistor dies 120'. For example, though FIG. 12 only illustrates two first IPD circuits 130, the uniform transistor-based component 110 may include K first IPD circuits 130. Similarly, though FIG. 12 only illustrates two second IPD circuits 140, the uniform transistor-based component 110 may include L second IPD circuits 140. In some embodiments, the uniform transistor-based component 110 may include no first IPD circuits 130, one first IPD circuit 130, or a plurality of first IPD circuits 130. In some embodiments, the uniform transistor-based component 110 may include no second IPD circuits 140, one second IPD circuit 140, or a plurality of second IPD circuits 140.

The first IPD circuit 130 and the second IPD circuit 140 may be configured similarly to the first and second IPD circuits 130, 140 described herein with respect to FIGS. 2 to 6. In other words, the first IPD circuit 130 may include a main IPD element 135 and one or more tunable IPD elements 138 and the second IPD circuit 140 may include a main IPD element 145 and one or more tunable IPD elements 148. In some embodiments, the first IPD circuit 130 may be substantially similar and/or identical to the second IPD circuit 140, though the present disclosure is not limited thereto.

The first IPD circuit 130 and the second IPD circuit 140 may be configured to be selectively coupled to a transistor die 120' by one or more bondwires 180. In addition, the tunable IPD elements 138, 148 may be configured to be selectively coupled to the main IPD elements 135, 145 of the first and second IPD circuits 130, 140. Example bondwires 180 are illustrated in dashed lines in FIG. 12 to illustrate how, in some embodiments, the elements of the uniform transistor-based component 110 may be interconnected. The bondwires 180 are illustrated using dashed lines to illustrate that both the location as well as the profile of the bondwires is selectively configurable, as described herein, and may be modified as necessary to modify the characteristics of the uniform transistor-based component 110.

In FIG. 12, the transistor die 120' is illustrated with dotted lines to indicate that the uniformity of the transistor die 120' may not be maintained between respective ones of the uniform transistor-based component 110. That is to say that a plurality of uniform transistor-based components 110 may be placed in a package, and the transistor die 120' may vary while the elements of the first IPD circuit 130 and/or the elements of the second IPD circuit 140 are maintained in a uniform fashion.

Figure 13:
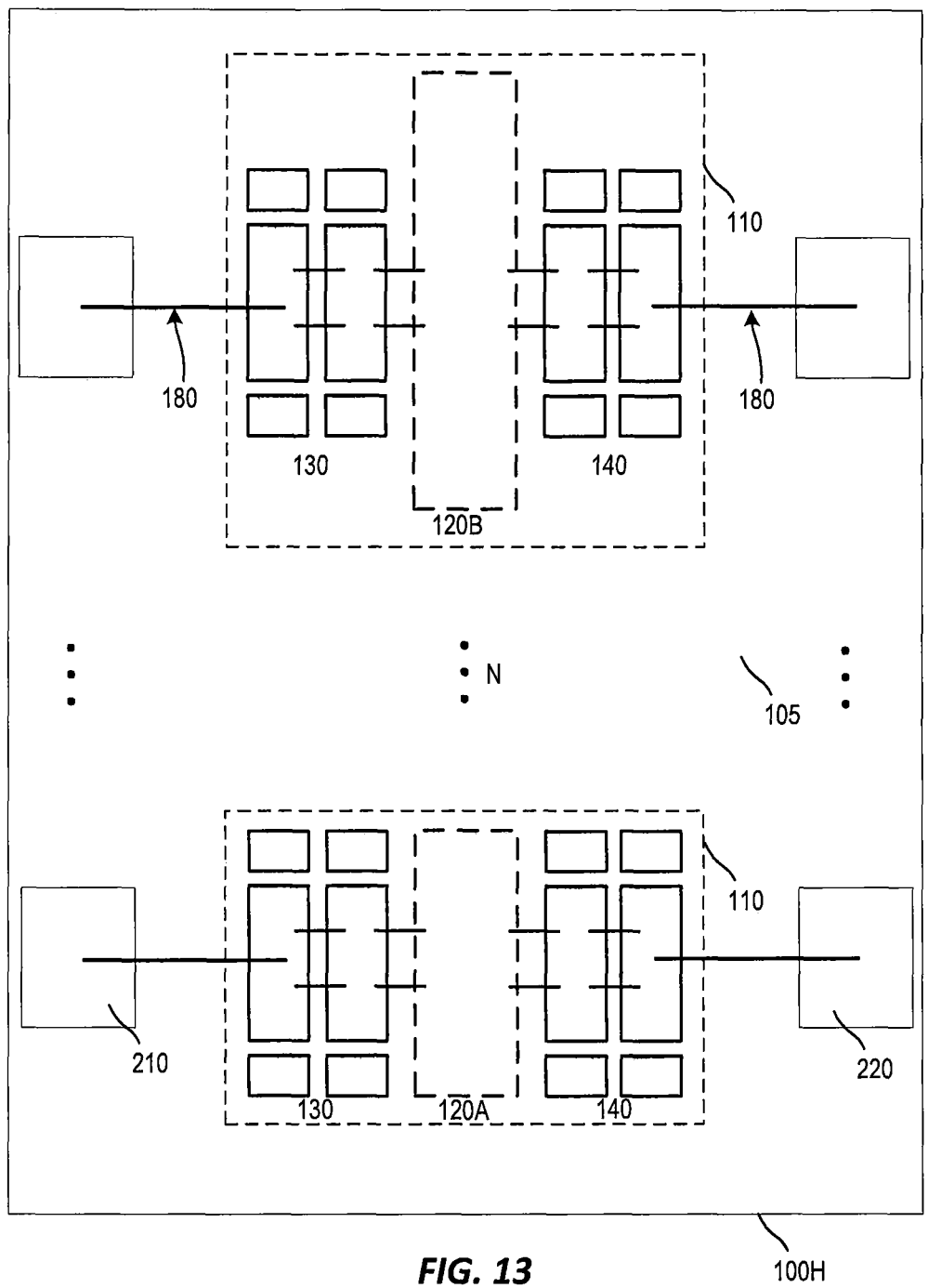
FIG. 13 illustrates an example of a package incorporating the uniform transistor-based component of FIG. 12.

For example, FIG. 13 illustrates an example of a package 100H incorporating the uniform transistor-based component 110 of FIG. 12. Referring to FIG. 13, a device package 100H may incorporate N uniform transistor-based components 110 that are each respectively coupled to a single input lead 210 and a single output lead 220. For example, one or more bondwires 180 may be coupled between a first input lead 210 and a first of the uniform transistor-based components 110, between a second input lead 210 and a second of the uniform transistor-based components 110, and between an Nth input lead 210 and an Nth of the uniform transistor-based components 110. Though only one bondwire 180 is illustrated in FIG. 13 respectively connecting the input leads 210 and the uniform transistor-based components 110, it will be understood that a plurality of bondwires 180 may be used. One or more bondwires 180 may be respectively coupled between the output leads 220 and the uniform transistor-based components 110 in a manner similar as between the input leads 210 and the uniform transistor-based components 110.

Within respective ones of the uniform transistor-based components 110, connections may be made between the circuits of the uniform transistor-based component 110 using bondwires 180. For example, as discussed herein, connections may be made between individual ones of the IPD circuits 130, 140, and between the IPD circuits 130, 140 and the transistor die 120, using bondwires 180. In some embodiments, bondwires 180 may be used to make connections between the main elements and the tunable elements of the IPD circuits, as discussed herein with respect to FIGS. 3A to 6. Thus, the connections between the input leads 210 and the respective uniform transistor-based components 110 may generate a particular type of amplifier package, while the arrangement of the bondwires 180 between and within the uniform transistor-based components 110 may allow for a number of variations of the device package 100A.

In FIG. 13, the devices of the first IPD circuit 130 and/or the second IPD circuit 140 of the various uniform transistor-based components 110 may be a uniform device. That is to say that each of the first IPD circuits 130 and/or each of the second IPD circuits 140 may be composed of same or similar devices. In some embodiments, the transistor die 120', however, may be allowed to vary. For example, referring to FIG. 13, a first transistor die 120A of a first uniform transistor-based component 110 may be different than a second transistor die 120B of a second uniform transistor-based component 110. For example, the first transistor die 120A may have a different gain, gate periphery, size, and/or device type than the second transistor die 120B.

By using the uniform IPD circuits incorporating tunable elements, the benefits of the uniform transistor-based component 110 may still be realized. For example, the tunable IPD elements 138, 148 of the IPD circuits 130, 140 may be used to adjust for the differences between the first transistor 120A and the second transistor 120B while still reducing the complexity of the manufacturing process used to manufacture the package 110H.

Though FIG. 13 illustrates only a single package configuration utilizing a uniform transistor-based component 110 in which the transistor die 120' is allowed to vary, it will be understood that other package configurations are possible without deviating from the present disclosure. For example, the uniform transistor-based component 110 of FIG. 12 could be utilized with any of the package configurations of FIGS. 9A through 9G, as well as others that would be understood by those of ordinary skill in the art, without deviating from the scope of the present disclosure.

Embodiments of the present disclosure may be used in various RF power products, e.g., for 5G and base station applications. Particular embodiments of the present disclosure may be used in massive Multiple Input Multiple Output (mMIMO) (e.g., 1-10 W) active antennas as well as various cellular infrastructure (CIFR) RF power products (including, but not limited to 5 W, 10 W, 20 W, 40 W, 60 W, 80 W and different frequency bands) e.g., for 5G and base station applications, including macro (e.g., 20-80 W and different frequency bands) average power applications. Embodiments of the present disclosure may also be applied to radar and monolithic microwave integrated circuit (MMIC)-type applications.

Figure 14:
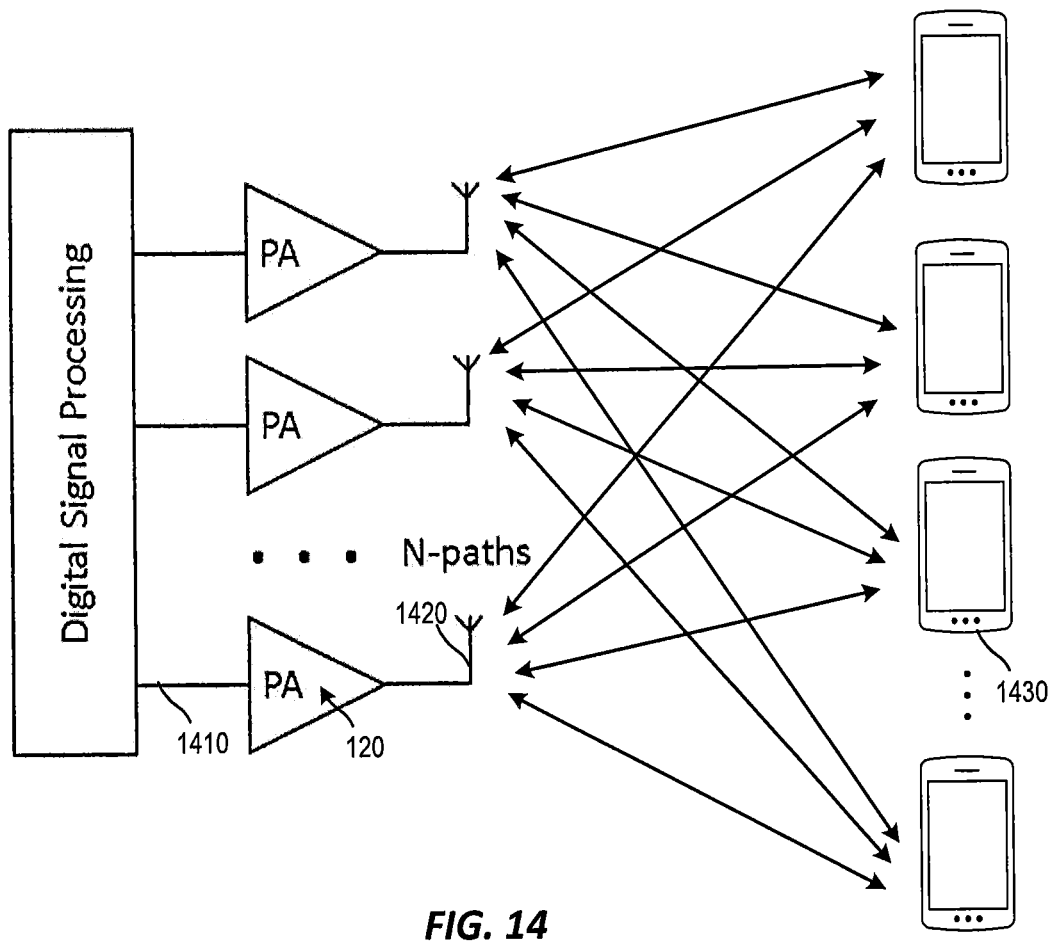
FIG. 14 illustrates an example of a massive Multiple Input Multiple Output (mMIMO) configuration that may utilize device packages according to some embodiments of the present disclosure.

FIG. 14 illustrates an example of an mMIMO configuration that may utilize device packages according to some embodiments of the present disclosure. Referring to FIG. 14, applications based on mMIMO technology may include multiple amplifier transmit/receive paths 1410 (illustrated as N paths in FIG. 14) coupled to multiple antennas 1420. For example, the number of paths 1410 may be 16, 32, 64, 128 . . . 1024 or higher, and each path may include an amplifier PA. The amplifier PA may be or incorporate a transistor die such as transistor die 120 illustrated and discussed herein. The multiple amplifiers may simultaneously transmit telecommunications signals from an mMIMO base station antenna array to a plurality of receiving clients 1430. In such applications, small size may be important. A device package such as those described herein may be utilized, and one or more of the package leads (e.g., output lead 220) may be coupled to one or more of the antennas 1420. Due to the large number of paths in an mMIMO configuration, each amplifier may transmit at a lower power. The output powers of each amplifier may be less than 50, 20, 10, or even 5 watts depending on antenna array configuration. In some embodiments, such as those incorporating mMIMO architecture, the signals processed by the semiconductor device may be Quadrature Amplitude Modulated (QAM) signals. In some embodiments, each path 1410 of the device (depending on the number of paths) may be 5 watts per antenna 1420 with a peak output power (Ppeak) of 40 watts per antenna. In some embodiments, a base station may include two 60 W paths combined to one antenna with 1000 W Ppeak. In some embodiments, the signals processed by the semiconductor device can be at various frequencies, such as 600-700 MHZ to 2.2 GHz for frequency division duplex transmit/receive scheme or 2.3 GHz or greater, such as up to 5 GHz or greater for time division duplex schemes.

By utilizing the uniform transistor-based component described herein, a small, finite number of devices may be combined in a configurable semiconductor device platform that be used in a way that provides device packages with a large amount of potential for customization while reducing a cost and complexity of the fabrication process. The embodiments described herein provide a process and apparatus in which multiple variations in the physical characteristics of the device package may be accomplished through the use of various configurations of bondwires. As a result, package variations may be achieved in a more convenient and cost-effective manner than previously possible. In addition, the use of multiple amplifier paths utilize common device configurations may allow for a device having the same or substantially the same phase symmetry between all or most of the amplifier paths of the package.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

It will be understood that several of the figures of the present disclosure are schematic diagrams and are sized for illustration purposes rather than proportional and literal accuracy. As described herein, some of the illustrated layers are in reality several orders of magnitude different from one another in size and/or thickness, and attempting to illustrate such literally would decrease, rather than increase the clarity of this description.

Various embodiments have been described herein with reference to the accompanying drawings in which example embodiments are shown. These embodiments may, however, be embodied in different forms and should not be construed as limited to the embodiments set forth herein. Rather, these embodiments are provided so that this disclosure is thorough and complete and fully conveys the inventive concept to those skilled in the art. Various modifications to the example embodiments and the generic principles and features described herein will be readily apparent. In the drawings, the sizes and relative sizes of layers and regions are not shown to scale, and in some instances may be exaggerated for clarity.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises," "comprising," "includes," and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on," "attached," or extending "onto" another element, it can be directly on the other element or intervening elements may also be present. In contrast, when an element is referred to as being "directly on" or "directly attached" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the disclosure are described herein with reference to cross-section illustrations that are schematic illustrations of idealized embodiments (and intermediate structures) of the disclosure. The thickness of layers and regions in the drawings may be exaggerated for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Elements illustrated by dotted lines may be optional in the embodiments illustrated.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A semiconductor device package comprising:
a first and a second input lead;
a first and a second output lead; and
a plurality of uniform transistor-based components, the plurality of uniform transistor-based components comprising a first subset including one or more first uniform transistor-based components coupled to the first input lead, and a second subset including one or more second uniform transistor-based components coupled to the second input lead,
wherein the first input lead and the first output lead define a first amplifier path therebetween,
wherein the second input lead and the second output lead define a second amplifier path therebetween,
wherein the first amplifier path and the second amplifier path are asymmetric with respect to one another, and
wherein each of the one or more first and second uniform transistor-based components respectively comprises a same matching device that is distinct from a transistor thereof and includes a first integrated passive device (IPD) circuit, wherein the first IPD circuit comprises a main element and a tunable element that is configured to be selectively connected to the main element to alter an impedance of the first IPD circuit to provide one of a first impedance and a second impedance that is different from the first impedance.

2. The semiconductor device package of claim 1, wherein the first uniform transistor-based components are coupled to the first input lead by one or more bondwires configured to deliver a first input power level to the first subset, and wherein the second uniform transistor-based components are coupled to the second input lead by one or more bondwires configured to deliver a second input power level to the second subset.

3. The semiconductor device package of claim 2, wherein the first input power level is different than the second input power level.

4. The semiconductor device package of claim 1, wherein the transistor of each of the first and second uniform transistor-based components comprises a same first transistor die.

5. The semiconductor device package of claim 4, wherein the first transistor die is a Group III nitride-based transistor amplifier.

6. The semiconductor device package of claim 1, wherein a first sum of gate peripheries of transistors of the first amplifier path is different than a second sum of gate peripheries of transistors of the second amplifier path.

7. The semiconductor device package of claim 1, wherein the main element and the tunable element each comprise a capacitive device, and
wherein the tunable element is configured to increase a capacitance of the first IPD circuit through connection to the main element.

8. The semiconductor device package of claim 1, wherein the first IPD circuit comprises a plurality of IPD circuits.

9. The semiconductor device package of claim 8, wherein the plurality of IPD circuits comprises a second IPD circuit that is electrically connected between the first input lead and a transistor die of the first uniform transistor-based components, and
a third IPD circuit that is electrically connected between the first input lead and the second IPD circuit.

10. The semiconductor device package of claim 1, wherein the first IPD circuit of each of the first uniform transistor-based components is configurable to provide a same impedance as the first IPD circuit of each of the second uniform transistor-based components.

11. The semiconductor device package of claim 1, wherein the first amplifier path consists of the first subset coupled between the first input lead and the first output lead, and the second amplifier path consists of the second subset coupled between the second input lead and the second output lead.

12. A semiconductor device package comprising:
a first and a second input lead;
a first and a second output lead;
a plurality of transistor dies, the plurality of transistor dies comprising a first subset including one or more first transistor dies coupled to the first input lead, and a second subset including one or more second transistor dies coupled to the second input lead; and
a plurality of uniform integrated passive device (IPD) circuits respectively comprising a same matching device, wherein the same matching device comprises a main element and a tunable element that is configured to be selectively connected to the main element to alter a configuration of a respective one of the uniform IPD circuits to provide one of a first impedance and a second impedance that is different from the first impedance,
wherein the first input lead and the first output lead define a first amplifier path therebetween,
wherein the second input lead and the second output lead define a second amplifier path therebetween,
wherein a first subset of the plurality of uniform IPD circuits is connected to the one or more first transistor dies,
wherein a second subset of the plurality of uniform IPD circuits is connected to the one or more second transistor dies, and
wherein the first amplifier path is selectively configured differently than the second amplifier path.

13. The semiconductor device package of claim 12, wherein the main element and the tunable element each comprise a capacitive device, and
wherein the tunable element is configured to be selectively connected to the main element to increase a capacitance of the respective one of the uniform IPD circuits.

14. The semiconductor device package of claim 12, wherein each of the first subset and the second subset of the plurality of transistor dies comprises a same transistor die.

15. The semiconductor device package of claim 12, wherein a first sum of gate peripheries of the first subset of the plurality of transistor dies of the first amplifier path is different than a second sum of gate peripheries of the second subset of the plurality of transistor dies of the second amplifier path.

16. A semiconductor device package comprising:
a plurality of input leads;
a plurality of output leads; and
a plurality of uniform transistor-based components, comprising:
a first subset comprising first uniform transistor-based components that are electrically connected between a first input lead of the input leads and a first output lead of the output leads, wherein the first input lead and the first output lead define a first amplifier path therebetween; and
a second subset comprising second uniform transistor-based components that are electrically connected between a second input lead of the input leads and a second output lead of the output leads, wherein the second input lead and the second output lead define a second amplifier path therebetween,
wherein each of the plurality of uniform transistor-based components respectively comprises a transistor die and a same matching device that is distinct from the transistor die and includes an integrated passive device (IPD) circuit,
wherein a first number of the first uniform transistor-based components of the first amplifier path is different than a second number of the second uniform transistor-based components of the second amplifier path, and
wherein the IPD circuit of each of the plurality of uniform transistor-based components comprises a main element and a tunable element that is configured to be selectively connected to the main element to alter an impedance of the IPD circuit to provide one of a first impedance and a second impedance that is different from the first impedance.

17. The semiconductor device package of claim 16, wherein the main element and the tunable element each comprise a capacitive device, and
wherein the tunable element is configured to be connected to the main element to increase a capacitance of the IPD circuit.

18. The semiconductor device package of claim 16, wherein the IPD circuit of each of the first uniform transistor-based components is a plurality of IPD circuits.

19. The semiconductor device package of claim 18, wherein each IPD circuit of the plurality of uniform transistor-based components is a same IPD circuit.

* * * * *

UNITED STATES PATENT AND TRADEMARK OFFICE
CERTIFICATE OF CORRECTION

PATENT NO. : 12,074,149 B2
APPLICATION NO. : 17/168251
DATED : August 27, 2024
INVENTOR(S) : Watts et al.

Page 1 of 1

It is certified that error appears in the above-identified patent and that said Letters Patent is hereby corrected as shown below:

In the Specification

Column 12, Line 58: Please correct "MN" to read --AlN--

Column 22, Line 5: Please correct "1402" to read --140_2--

Signed and Sealed this
Nineteenth Day of November, 2024

Katherine Kelly Vidal
*Director of the United States Patent and Trademark Office*